US010729030B1

(12) United States Patent
Cousineau et al.

(10) Patent No.: US 10,729,030 B1
(45) Date of Patent: Jul. 28, 2020

(54) APPARATUSES, SYSTEMS, AND METHODS FOR INTEGRATING HARDWARE ACCELERATORS INTO COMPUTING SYSTEMS

(71) Applicant: Facebook, Inc., Menlo Park, CA (US)

(72) Inventors: Austin Joel Cousineau, Menlo Park, CA (US); Hao Shen, Milpitas, CA (US); Christian Markus Petersen, Golden, CO (US); William Arnold, Menlo Park, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/115,126

(22) Filed: Aug. 28, 2018

(51) Int. Cl.
*H05K 7/00* (2006.01)
*H05K 7/14* (2006.01)
*H05K 3/34* (2006.01)
*H05K 3/30* (2006.01)

(52) U.S. Cl.
CPC .......... *H05K 7/1418* (2013.01); *H05K 3/301* (2013.01); *H05K 3/3405* (2013.01); *H05K 2201/09063* (2013.01)

(58) Field of Classification Search
None
See application file for complete search history.

(56) References Cited

U.S. PATENT DOCUMENTS

| | | | | |
|---|---|---|---|---|
| 6,798,669 B1 * | 9/2004 | Hsu | ........................ | G06F 1/184 361/726 |
| 7,330,358 B2 * | 2/2008 | Chen | ...................... | H05K 7/142 361/752 |
| 7,535,731 B2 * | 5/2009 | Peng | ........................ | G06F 1/184 361/801 |
| 7,876,569 B2 * | 1/2011 | Xue | ......................... | G06F 1/184 361/732 |
| 8,562,036 B2 * | 10/2013 | Zhou | .................... | H01M 2/1061 292/256 |
| 8,929,088 B2 * | 1/2015 | Ma | ......................... | H05K 7/142 361/759 |

(Continued)

OTHER PUBLICATIONS

"Edge Connector," accessed at https://en.wikipedia.org/w/index.php?title=Edge_connector&oldid=736591535, accessed on Aug. 28, 2018.

(Continued)

*Primary Examiner* — Courtney L Smith
*Assistant Examiner* — Rashen E Morrison
(74) *Attorney, Agent, or Firm* — FisherBroyles, LLP

(57) ABSTRACT

A disclosed expansion socket may include a primary slot and a secondary slot, each mounted to a receiver printed circuit board and electrically coupled to a central processing unit via a computing bus. The primary slot may be dimensioned to receive a primary pinout disposed within a primary portion of an edge connector disposed on a connecting edge of a presenter printed circuit board. Likewise, the secondary slot may be positioned and dimensioned to receive a secondary pinout, disposed within a secondary portion of the edge connector, when the primary slot receives the primary portion of the edge connector. Furthermore, the primary pinout and the secondary pinout may each conform to a compact pinout specification that is more compact than a pinout specification defined for the computing bus. Various other systems and methods are also disclosed.

20 Claims, 17 Drawing Sheets

(56) References Cited

U.S. PATENT DOCUMENTS

| | | | | |
|---|---|---|---|---|
| 9,207,709 | B2* | 12/2015 | Xie | G06F 1/16 |
| 9,760,120 | B2* | 9/2017 | Wu | G06F 1/1637 |
| 9,854,673 | B2* | 12/2017 | Yang | G06F 1/185 |
| 9,933,822 | B2* | 4/2018 | Tan | H05K 5/0008 |
| 10,008,791 | B1* | 6/2018 | Masumoto | F16B 35/06 |
| 2013/0216303 | A1* | 8/2013 | Tang | H05K 7/1405 |
| | | | | 403/326 |
| 2013/0258629 | A1* | 10/2013 | Fu | G06F 1/185 |
| | | | | 361/785 |
| 2016/0066450 | A1* | 3/2016 | Morita | H05K 5/0217 |
| | | | | 361/679.01 |
| 2017/0371383 | A1* | 12/2017 | Yang | G06F 1/185 |
| 2018/0006391 | A1* | 1/2018 | Alcorn | G06F 1/185 |

OTHER PUBLICATIONS

"Expansion Card," accessed at https://en.wikipedia.org/w/index.php?title=Expansion_card&oldid=852493355, accessed on Aug. 28, 2018.

"M.2," accessed at https://en.wikipedia.org/w/index.php?title=M.2&oldid=849419042, accessed on Aug. 28, 2018.

"Pinout," accessed at https://en.wikipedia.org/w/index.php?title=Pinout&oldid=846198631, accessed on Aug. 28, 2018.

* cited by examiner

APPARATUSES, SYSTEMS, AND METHODS FOR INTEGRATING HARDWARE ACCELERATORS INTO COMPUTING SYSTEMS

BACKGROUND

Demand for efficient execution of complex computational tasks (such as video transcoding and artificial intelligence operations, among others) is expanding at an ever-increasing rate. Complex computational tasks are often assigned to powerful data center servers (e.g., domain controllers), as other devices (e.g., edge servers) may lack the computing resources necessary to effectively and/or efficiently complete these demanding tasks. However, deploying and maintaining domain controllers may be expensive, and adding domain controllers to scale a data center for high-demand computing tasks may be inefficient and/or impractical, especially in high-growth points-of-presence (POPS) traditionally serviced by edge servers. Moreover, due to their general-purpose design, domain controllers may struggle with and/or inefficiently handle some highly specific and demanding tasks.

Additionally, while some hardware devices may exist to accelerate some of the operations included in some of these computationally intensive tasks, such devices may be difficult, due to physical space limitations, computing power restrictions, electrical power requirements, and/or data bandwidth considerations, to integrate into some computing devices, such as edge servers. Therefore, the present disclosure identifies and addresses a need for new and/or improved apparatuses, systems, and methods for integrating hardware accelerators into computing systems.

SUMMARY

As will be described in greater detail below, the instant disclosure describes various apparatuses, systems, and methods for integrating hardware accelerators into computing systems via dual-compact-form-factor expansion sockets. In one example, such an expansion socket may include a receiver printed circuit board that is electrically coupled to a central processing unit of a computing device via a computing bus. The expansion card may further include a primary slot, mounted to the receiver printed circuit board via a mounting portion of the primary slot and electrically coupled to the central processing unit via the computing bus. The primary slot may (1) be dimensioned to receive a primary pinout disposed within a primary portion of an edge connector, the edge connector disposed on a connecting edge of a presenter printed circuit board, and (2) electrically couple the primary portion of the edge connector to the central processing unit via the primary pinout while the primary portion of the edge connector is inserted into the primary slot.

In some examples, the expansion socket may also include a secondary slot, mounted to the receiver printed circuit board via a mounting portion of the secondary slot and electrically coupled to the central processing unit via the computing bus. The secondary slot may (1) be positioned on the receiver printed circuit board and dimensioned to receive a secondary pinout disposed within a secondary portion of the edge connector when the primary slot receives the primary portion of the edge connector, and (2) electrically couple the secondary portion of the edge connector to the central processing unit via the secondary pinout while the secondary portion of the edge connector is inserted into the secondary slot.

Furthermore, in various examples, each of the primary pinout and the secondary pinout may conform to a compact pinout specification, included in a compact expansion card specification, that is more compact than a pinout specification defined for the computing bus. In some examples, the compact expansion card specification may include at least one of (1) an M.2 specification, (2) a U.2 specification, or (3) an mSATA specification.

In at least one embodiment, the primary slot may include a primary plurality of female contacts disposed within the primary slot in accordance with the compact pinout specification, and the secondary slot may include a secondary plurality of female contacts disposed within the secondary slot in accordance with the compact pinout specification.

In at least one example, the primary slot and the secondary slot may be disposed upon the receiver printed circuit board such that (1) the primary slot and the secondary slot are each oriented in a common direction, (2) a central longitudinal axis of the secondary slot may be aligned parallel to a central longitudinal axis of the primary slot, (3) the central longitudinal axis of the secondary slot may be positioned along the central longitudinal axis of the primary slot, and (4) a central lateral axis of the primary slot may be disposed a predefined distance from a central lateral axis of the secondary slot. In some examples, the predefined distance from the central lateral axis of the secondary slot may be, within a predefined manufacturing tolerance, up to 22.5 millimeters.

In some embodiments, each of the primary slot and the secondary slot may include a predetermined width dimension that conforms to a width specification included in the compact expansion card specification. In at least one embodiment, the predetermined width dimension of each of the primary slot and the secondary slot may be, within a predefined manufacturing tolerance, 20.15 millimeters.

In some examples, the primary slot may define a primary alignment key in accordance with the compact expansion card specification, the primary alignment key including a predefined key width. In further examples, the secondary slot may define a secondary alignment key in accordance with the compact expansion card specification, the secondary alignment key including the predefined key width. In at least one example, the predefined key width may be at least, within a predefined manufacturing tolerance, 1.1 millimeters.

In at least one embodiment, the expansion socket may further include a height dimension sufficient to accommodate a heat sink coupled to the presenter printed circuit board when the primary portion of the edge connector is inserted into the primary slot and the secondary portion of the edge connector is inserted into the secondary slot. In at least one example, the height dimension may be at least, within a predefined manufacturing tolerance, 6.7 millimeters.

In one or more embodiments, the receiver printed circuit board may include an intermediary expansion card that may include a pinout that conforms to the pinout specification defined for the computing bus.

In some embodiments, while the primary portion of the edge connector is inserted into the primary slot and the secondary portion of the edge connector is inserted into the secondary slot, (1) a hardware accelerator, disposed on the presenter printed circuit board and that includes application-specific hardware circuitry designed to perform a computing task, may be electrically coupled to the central processing unit via the edge connector, and (2) the hardware accelerator may offload at least a portion of the computing task from the central processing unit by executing, via the application-specific hardware circuitry, the portion of the computing task.

Similarly, a system that incorporates the above-described apparatus may further include a central processing unit, at least one memory device, and at least one expansion card that includes (1) a presenter printed circuit board, and (2) an edge connector disposed on a connecting edge of the printed circuit board. The edge connector may include a primary portion and a secondary portion.

The system may also include at least one expansion socket that may include a receiver printed circuit board that is electrically coupled to the central processing unit via a computing bus. The expansion socket may further include a primary slot, mounted to the receiver printed circuit board via a mounting portion of the primary slot and electrically coupled to the central processing unit via the computing bus. The primary slot may (1) be dimensioned to receive a primary pinout disposed within the primary portion of the edge connector, and (2) electrically couple the primary portion of the edge connector to the central processing unit via the primary pinout when the primary portion of the edge connector is inserted into the primary slot.

The expansion socket may further include a secondary slot, mounted to the receiver printed circuit board via a mounting portion of the secondary slot and electrically coupled to the central processing unit via the computing bus. The secondary slot may (1) be positioned on the receiver printed circuit board and dimensioned to receive a secondary pinout disposed within the secondary portion of the edge connector when the primary slot receives the primary portion of the edge connector, and (2) electrically couple the secondary portion of the edge connector to the central processing unit via the secondary pinout when the secondary portion of the edge connector is inserted into the secondary slot. Furthermore, each of the primary pinout and the secondary pinout may conform to a compact pinout specification, included in a compact expansion card specification, that is more compact than a pinout specification defined for the computing bus.

In some embodiments, the receiver printed circuit board may include an intermediary expansion card that may include a pinout that conforms to the pinout specification defined for the computing bus.

In at least one embodiment, the system may further include a chassis that is dimensioned to accept a plurality of modular computing devices. In such embodiments, the expansion socket may be included in a modular computing device inserted into the chassis. In some examples, the system may include a chassis that is dimensioned to accept a plurality of modular storage devices. In such examples, the expansion socket may be included in a modular storage device inserted into the chassis.

In at least one example, the system may include a backend data center of a corporate networking enterprise that provides at least one online service to corresponding users of client devices. In some examples, the online service may include at least one of (1) a social networking service, a virtual reality service, or a cloud storage service.

A corresponding method may include inserting an expansion card into an expansion socket of a computing device. The expansion socket may include a receiver printed circuit board that is electrically coupled to a central processing unit of the computing device via a computing bus. The expansion socket may also include a primary slot, mounted to the printed circuit board via a mounting portion of the primary slot and electrically coupled to the central processing unit of the computing device via the computing bus. The primary slot may (1) be dimensioned to receive a primary pinout disposed on a primary portion of an edge connector, the edge connector disposed on a connecting edge of a presenter printed circuit board included as part of the expansion card, and (2) electrically couple the primary portion of the edge connector to the central processing unit via the primary pinout when the primary portion of the edge connector is inserted into the primary slot.

The expansion socket may further include a secondary slot, mounted to the receiver printed circuit board via a mounting portion of the secondary slot and electrically coupled to the central processing unit via the computing bus. The secondary slot may (1) be positioned on the receiver printed circuit board and dimensioned to receive a secondary pinout, disposed on a secondary portion of the edge connector, when the primary slot receives the primary portion of the edge connector, and (2) electrically couple the secondary portion of the edge connector to the central processing unit via the secondary pinout when the secondary portion of the edge connector is inserted into the secondary slot.

Furthermore, each of the primary pinout and the secondary pinout may conform to a compact pinout specification, included in a compact expansion card specification, that is more compact than a pinout specification defined for the computing bus.

The method may further include, while the expansion card is inserted into the expansion socket, offloading at least a portion of a computing task from the central processing unit by executing the portion of the computing task via application-specific hardware circuitry included in a hardware accelerator disposed on the printed circuit board and designed to perform the computing task. The hardware accelerator may be electrically coupled to the central processing unit via the edge connector while the expansion card is inserted into the expansion socket.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
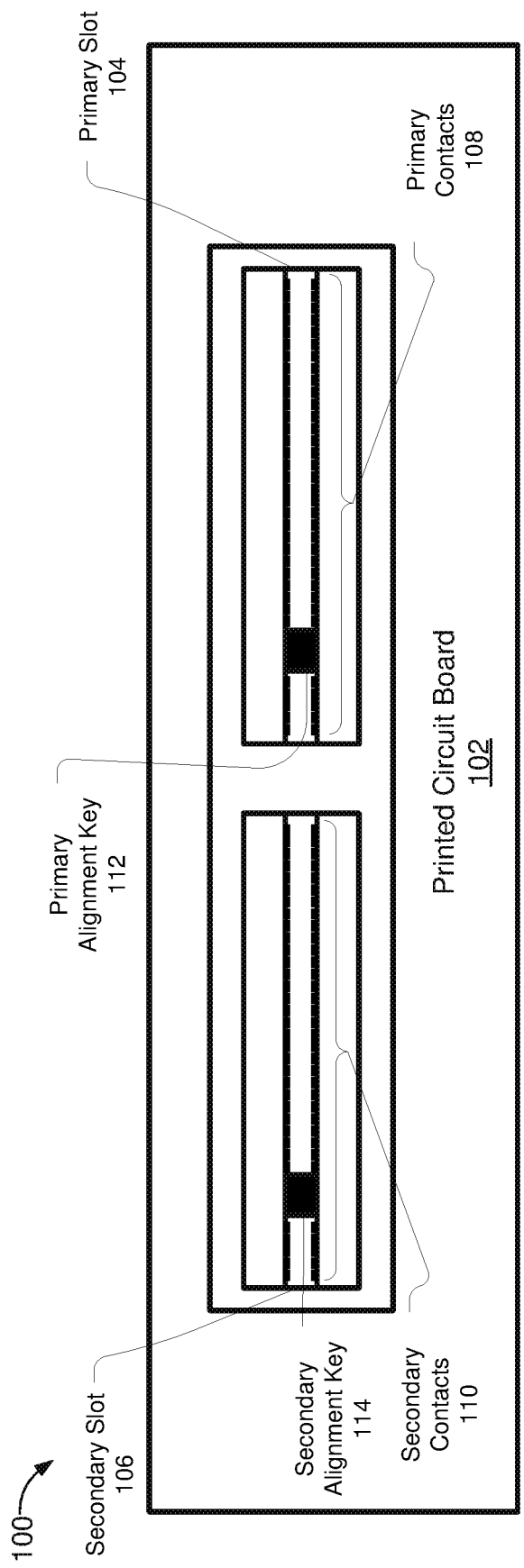
FIGS. 1-2 are block diagrams of an example expansion socket that may be capable of integrating a hardware accelerator into a computing system.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to apparatuses, systems and methods for integrating hardware accelerators into computing systems. As will be explained in greater detail below, the apparatuses, systems, and methods disclosed herein may enable efficient, effective, and scalable hardware acceleration of complex computational tasks by integrating hardware accelerators into computing systems via dual-compact-form-factor expansion sockets.

Example dual-compact-form-factor expansion sockets may include at least two expansion slots (e.g., a primary slot, a secondary slot, etc.) that may each be configured (e.g., arranged, oriented, positioned, dimensioned, assembled, equipped, etc.) to receive a pinout that conforms to a compact pinout specification included in a compact expansion card specification (e.g., an M.2 specification, a U.2 specification, an mSATA specification, etc.). Such a compact pinout specification may be more compact than a pinout specification defined for a computing bus (e.g., a PCI EXPRESS bus) that may facilitate communication between components of an expansion card (e.g., a hardware accelerator included in the expansion card) and a central processing unit of a computing device. Each expansion slot (also "slot" herein) included in a dual-compact-form-factor expansion socket may be configured to physically and electrically couple to such a pinout in accordance with the compact pinout specification (e.g., in accordance with a complementary expansion socket specification).

Such a dual-compact-form-factor expansion socket may be configured (e.g., arranged, oriented, positioned, dimensioned, assembled, equipped, etc.) to integrate a dual-compact-form-factor expansion card into a computing system. As will be described in greater detail below, a "dual-compact-form-factor expansion card" may include any expansion card that includes a plurality of pinouts (e.g., a primary pinout, a secondary pinout, etc.), disposed within (e.g., along) an edge connector that is disposed on a connecting edge of a printed circuit board, that each conform to at least one compact pinout specification included in a compact expansion card specification (e.g., an M.2 specification, a U.2 specification, an mSATA specification, etc.). Such a dual-compact-form-factor expansion card may include one or more hardware accelerators.

While traditional compact-form-factor expansion sockets (e.g., M.2 expansion sockets, U.2 expansion sockets, mSATA expansion sockets, etc.) may be used for storage and wireless communication applications, they may have characteristics that are not ideal for some hardware acceleration applications. For example, traditional compact-form-factor expansion sockets may have electrical characteristics and/or data transfer capabilities that may restrict performance attributes of hardware accelerators that may be hosted via such traditional compact-form-factor expansion sockets.

By simultaneously receiving and electrically coupling to a plurality of pinouts (e.g., a primary pinout, a secondary pinout, etc.) included in a dual-compact-form-factor expansion card, the apparatuses, systems, and methods described herein may simultaneously make resources (e.g., electrical resources, bandwidth resources, logical resources, etc.) associated with a plurality of traditional compact expansion card sockets (e.g., M.2 sockets, U.2 sockets, mSATA sockets, etc.) available a received dual-compact-form-factor expansion card. The expansion card may then aggregate the provided resources in order to support features, such as advanced hardware accelerators, that may require and/or utilize such resources. Therefore, dual-compact-form-factor expansion sockets as disclosed herein may host—and effectively offload complex computational tasks to—advanced hardware accelerators that may have higher requirements (e.g., power requirements, bandwidth requirements, logical requirements, etc.) than hardware accelerators that may otherwise be hosted via traditional expansion sockets (e.g., traditional compact-form-factor expansion sockets).

Furthermore, traditional compact-form-factor expansion sockets may be inadequate to effectively integrate dual-compact-form-factor expansion cards into computing systems. Tight tolerances and/or conductor pitches of compact pinout specifications (e.g., an M.2 specification), as well as close fits required by alignment features of such compact pinout specifications, may increase a risk of mechanical interference during insertion of a dual-compact-form-factor expansion card into traditional compact-form-factor expansion sockets. This mechanical interference may result in pin misalignment and overlap, and may potentially damage the dual-compact-form-factor expansion cards and/or the traditional compact-form-factor expansion sockets. Hence, specialized dual-compact-form-factor expansion sockets, as disclosed herein, may more effectively support integration of dual-compact-form-factor expansion cards into computing systems than traditional solutions.

In some examples, a "dual-compact-form-factor expansion socket" may include any expansion socket that includes a plurality of expansion slots, configured and disposed (e.g., on a common line on a receiver printed circuit board) so as to receive an edge connector that includes multiple pinouts that each conform to at least one compact pinout specification (e.g., an M.2 specification, a U.2 specification, an mSATA specification, etc.). Indeed, although some of the examples illustrated herein may include dual expansion slots (e.g., a primary slot and a secondary slot) and/or may be arranged along a printed circuit board in an arrangement that may be related to dimensions included in a compact expansion card specification and/or a compact expansion socket specification, the principles described herein may encompass a variety of expansion sockets having a variety of characteristics such as, without limitation, any plurality of expansion slots, any suitable arrangement of expansion slots, any suitable expansion slot configurations (e.g., expansion slot dimensions, female contact configurations, alignment key configurations, etc.), and so forth.

The following will provide, with reference to FIGS. 1-4, examples and illustrations of dual-compact-form-factor expansion sockets that are capable of integrating hardware accelerators into computing systems as described herein. Additionally, the description corresponding to FIGS. 5-7 and FIG. 9 will provide examples and illustrations of expansion cards that may be integrated into computing systems via example dual-compact-form-factor expansion sockets. The description corresponding to FIGS. 8A-8C will provide an overview of exemplary techniques for inserting and/or removing example dual-compact-form-factor expansion cards into corresponding example dual-compact-form-factor expansion sockets. The description corresponding to FIGS. 10-14 will illustrate ways dual-compact-form-factor expansion sockets may provide scalable hardware acceleration capabilities to various computing systems, while the description corresponding to FIG. 12 will describe an exemplary workflow for adding hardware acceleration capabilities to a computing device using one or more of the example dual-compact-form-factor expansion sockets illustrated in previous figures.

FIG. 1 is a block diagram of an example dual-compact-form-factor expansion socket 100 ("expansion card 100") capable of integrating hardware accelerators into a computing system according to the systems and methods disclosed herein. As shown in this figure, expansion socket 100 may include (e.g., may be mounted to) receiver printed circuit board 102. Although not shown explicitly in FIG. 1, expansion socket 100 may also be electrically coupled, via receiver printed circuit board 102 and a suitable computing bus, to a central processing unit of a computing device.

In some examples, an "expansion socket" may include any electrical connector configured to receive and electrically couple to an edge connector disposed on an expansion card. An expansion socket may include a housing that may be open on one side and that may define and/or include a set of slots (e.g., a set of long, narrow apertures or slits), with each slot being configured (e.g., dimensioned, arranged, equipped, manufactured, etc.) to receive a pinout disposed on a portion of the edge connector of the expansion card. Likewise, as will be described in greater detail below, an "expansion card" may include a card, such as a card substantially formed by and/or upon a printed circuit board, that is configured for insertion into a corresponding computing device and/or expansion socket to thereby expand the functionality of the computing device.

In some examples, an "edge connector" may include one or more connections at an edge of an expansion card that couple the expansion card to a corresponding computing bus or computing device. In some examples, an edge connector may be formed of a portion of a printed circuit board, and may include traces (i.e., pins) on the printed circuit board leading to the edge of the board, which may be designed or configured to be plugged into a matching socket. In general, an edge connector may include a male connector that matches a corresponding female connector or expansion socket at a computing device (e.g., on the computing device motherboard).

As further shown in FIG. 1, expansion socket 100 may include a primary slot 104 and a secondary slot 106. Each of primary slot 104 and secondary slot 106 may be mounted to receiver printed circuit board 102 via respective mounting portions, and may be configured (e.g., dimensioned, arranged, equipped, manufactured, etc.) to receive a pinout disposed on a portion of an edge connector included in a dual-compact-form-factor expansion card. In some examples, each slot may include a plurality of female contacts disposed therein in accordance with a compact pinout specification (e.g., primary contacts 108 and secondary contacts 110, respectively). Additionally, in accordance with a compact pinout specification, each slot may define and/or include one or more alignment keys (e.g., primary alignment key 112 and secondary alignment key 114 in FIG. 2). Such alignment keys, by their size, relative position, and/or other keying features, may facilitate insertion of and/or alignment of edge connectors and/or edge connector contacts.

In some examples, a "pinout" may refer to a cross-reference between the contacts, or pins, of an electrical connector or electronic component, such as an expansion card, as well as the functions of these contacts or pins. In some examples, a "pinout specification" may define an arrangement and/or configuration of pins for a particular application or interface.

In some embodiments, a "compact pinout specification" may define an arrangement and/or configuration of pins that may be more compact than a pinout that conforms to another pinout specification. By way of example, and without limitation, a compact pinout specification may specify that a pinout that conforms to the compact pinout specification may include, when compared to another pinout that conforms to the other pinout specification: (1) a narrower, thinner, or otherwise smaller width dimension; (2) a narrower, thinner, or otherwise smaller thickness dimension; (3) a closer pin pitch; and/or (4) narrower, thinner, or smaller pins. Additionally or alternatively, a compact pinout specification may specify that a pinout that conforms to the compact pinout specification may be smaller in any other manner or dimension than a pinout that conforms to another pinout specification. As will be described in greater detail below, a compact pinout specification may be included as part a compact expansion card specification that may specify parameters for a compact expansion card and/or an expansion socket (e.g., expansion socket 100) that may receive such a compact expansion card.

An example of a compact pinout specification may be a pinout specification included in a specification for M.2 cards. M.2 cards may have a set of 75 pin spaces, and this set of pin space may be 12 mm, 16 mm, 22 mm, or 30 mm wide. The pins may also have a length of 2.00 mm and a pitch of 0.5 mm. In contrast, the specification for a native PCI EXPRESS x1 pinout may define a pitch of at least 1.0 mm, a width of at least 35 mm, and a length of at least 2.3 mm. Thus, an M.2 pinout, which may connect to a PCI EXPRESS bus, may be said to be more compact than a pinout defined by a specification for the PCI EXPRESS bus since at least one dimension of the M.2 pinout is smaller than the pinout defined by the specification for the PCI EXPRESS bus.

In one example, expansion socket 100 may include a plurality of slots that may each conform to one or more mixed-pin pinout specifications. As used herein, the term "mixed-pin" generally refers to a pinout included in an expansion card that differs from a pinout of the specification of a computing bus to which the expansion card couples via a suitable expansion socket. In some examples, the expansion socket may successfully couple the expansion card with the computing bus, despite the conflict between the two pinouts, because the corresponding expansion socket may include one or more items of intermediary circuitry that effectively couples connections and/or translates data from the pinout included in the expansion card into a format accepted by the computing bus, and vice versa. Illustrative examples of mixed-pin specifications to which the pinout of an edge connector may conform, and that an expansion socket may be configured to receive, may include, without limitation, an M.2 pinout specification, a U.2 pinout specification, and/or an mSATA pinout specification.

By way of illustration, as shown in FIG. 1, primary slot 104 and secondary slot 106 may each be configured to receive a pinout of an edge connector that conforms to an "M-key" compact pinout specification. Hence, primary slot 104 and secondary slot 106 may each be dimensioned and equipped to receive such a pinout. Each of primary slot 104 and secondary slot 106 may have a width of 20.15 mm, within a manufacturing tolerance of 0.15 mm (specifications that include such manufacturing tolerances may be referred to herein via the convention "20.15 mm±0.15 mm"), may include 67 female contacts arranged within the corresponding slot to electrically couple the edge connector to the central processing unit in accordance with the respective pinout, and may include an alignment key having a width of 1.1 mm±0.05 mm located at a position within the slot that corresponds to an "M" position of the respective pinout when the respective edge connector is inserted into the respective slot. Although primary slot 104 and secondary slot 106 in FIGS. 1 and 2 may each be configured to receive a pinout that conforms to an M-key pinout specification included in an M.2 compact expansion card specification, this is merely illustrative, as a slot included in a dual-compact-form-factor expansion socket may conform to any suitable compact pinout specification.

In some examples, each of primary slot 104 and secondary slot 106 may have the same dimensions, tolerances, pin configurations, and so forth, of an individual compact expansion card socket (e.g., an expansion socket configured to receive a traditional compact-form-factor expansion card, such as an M.2 expansion card). As an example, primary slot 104 and/or secondary slot 106 may have the same dimensions and tolerances of an individual M.2 expansion socket, such as a connector edge of 20.15 mm±0.05 mm, a key dimension of 1.1 mm±0.05 mm, and so forth. Such consistency may reduce a risk of connector misalignment and/or damage when individual M.2 devices may be inserted into either primary slot 104 or secondary slot 106.

Figure 2:
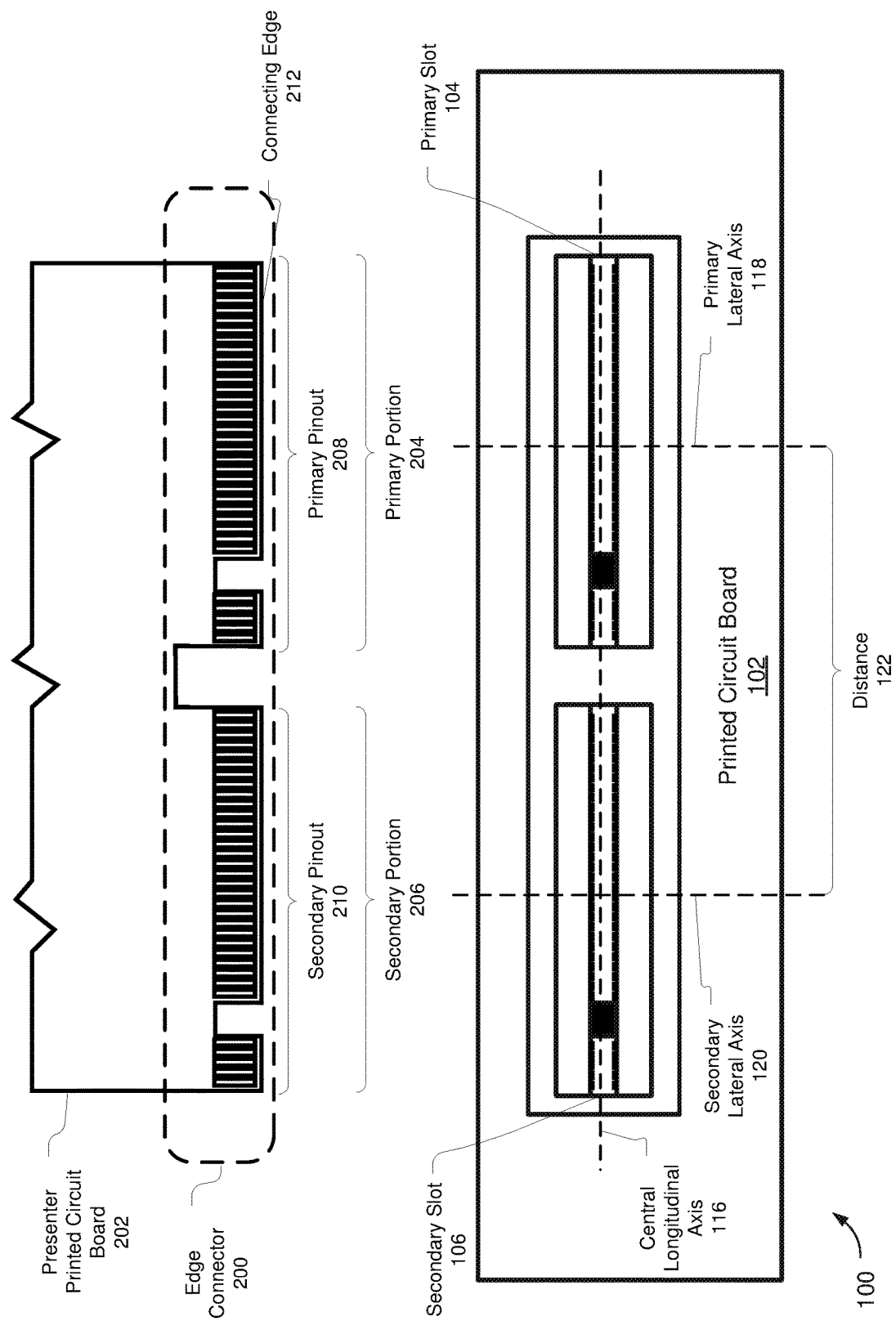

Additionally, primary slot 104 and secondary slot 106 may be arranged on receiver printed circuit board 102 such that expansion socket 100 may receive a dual-compact-form-factor expansion card. To illustrate, FIG. 2 shows expansion socket 100 in relation to an edge connector 200 of an example dual-compact-form-factor expansion card. As shown, edge connector 200 may be disposed on a connecting edge 212 of a presenter printed circuit board 202. Furthermore, edge connector 200 may include a primary portion 204 and a secondary portion 206. Each of primary portion 204 and secondary portion 206 may include a pinout that conforms to compact pinout specification. For example, primary portion 204 may include a primary pinout 208 and secondary portion 206 may include a secondary pinout 210. As shown, each of primary pinout 208 and secondary pinout 210 may conform to an M-key pinout specification as may be included in an M.2 expansion card specification.

In the configuration shown in FIG. 2, expansion socket 100 may receive edge connector 200 by (1) receiving primary portion 204 of edge connector 200 and electrically coupling primary portion 204 to a central processing unit via primary pinout 208, and (2) receiving secondary portion 206 of edge connector 200 and electrically coupling secondary portion 206 to a central processing unit via secondary pinout 210.

In some examples, as illustrated by FIG. 2, primary slot 104 and secondary slot 106 may be disposed (e.g., positioned, arranged, oriented, etc.) such that primary slot 104 and secondary slot 106 may be oriented in a common direction (e.g., an opening of primary slot 104 and an opening of secondary slot 106 may face a common direction), and may be mounted to a common plane (e.g., a plane defined by receiver printed circuit board 102). Additionally, primary slot 104 and secondary slot 106 may disposed on receiver printed circuit board 102 such that (1) a central longitudinal axis of secondary slot 106 may be aligned parallel to a central longitudinal axis of primary slot 104, and (2) the central longitudinal axis of secondary slot 106 may be positioned along the central longitudinal axis of primary slot 104. This arrangement may be indicated by central longitudinal axis 116, which may indicate that both primary slot 104 and secondary slot 106 share (e.g., are centrally positioned at different points along) central longitudinal axis 116.

In some examples, primary slot 104 and secondary slot 106 may be positioned on receiver printed circuit board 102 relative to one another and/or a particular or anticipated pinout configuration of an edge connector. For example, primary slot 104 may be positioned to receive primary pinout 208, which may be disposed within primary portion 204 of edge connector 200, which edge connector 200 may be disposed on a connecting edge 212 of printed circuit board 202. Secondary slot 106 may be positioned on receiver printed circuit board 102 in a location and/or orientation where secondary slot 106 may receive secondary pinout 210, which may be disposed within secondary portion 206 of edge connector 200, substantially contemporaneously to a time when primary slot 104 receives primary pinout 208.

Furthermore, in some examples, primary slot 104 and secondary slot 106 may be disposed on receiver printed circuit board 102 such that they are separated by a predefined distance. For example, each of primary slot 104 may have an associated central lateral axis, indicated in FIG. 2 by primary lateral axis 118 and secondary lateral axis 120, respectively. In some embodiments, primary slot 104 and secondary slot 106 may each be disposed (e.g., positioned, arranged, oriented, etc.) on receiver printed circuit board 102 such that primary lateral axis 118 and secondary lateral axis 120 are separated by a predefined distance 122. In some embodiments, distance 122 may correspond to a spacing or "pitch" of a plurality of pinouts included in a dual-compact-form-factor expansion card. In some examples, the predefined distance may be up to 22.5 mm. In other examples, the predefined distance may exceed 22.5 mm.

Figure 3:
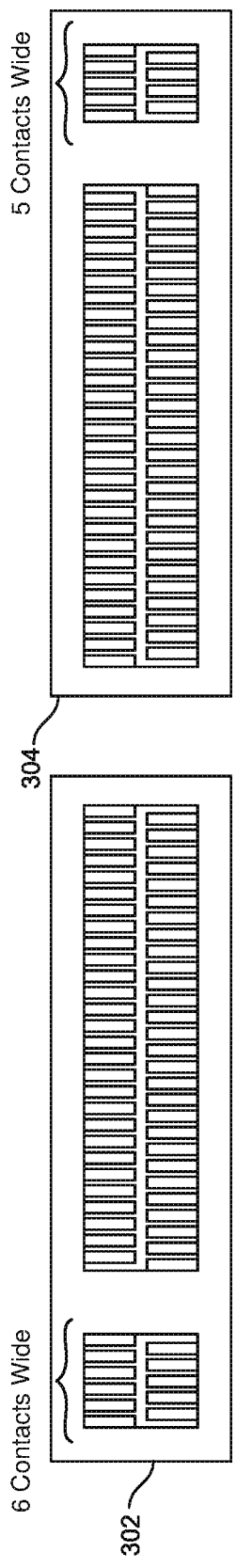
FIG. 3 is a set of block diagrams of various example compact pinouts that may be used by the expansion sockets described herein.
Figure 3:
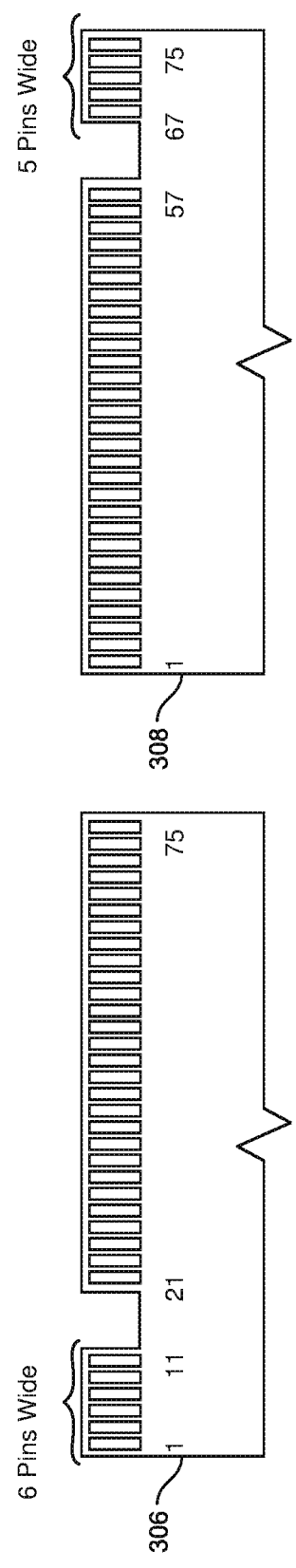
Figure 3:
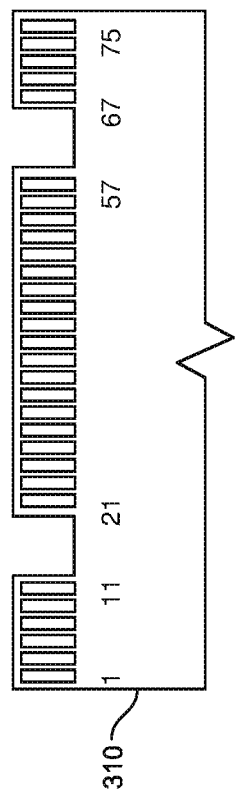

As detailed above, a dual-compact-form-factor expansion socket (e.g., expansion socket 100) may include a plurality of slots that may each be configured to receive a pinout that conforms to a compact pinout specification. Each pinout may conform to one or more mixed-pin pinout specifications, such as the M.2 specification. FIG. 3 illustrates various examples of pinout configurations, conforming to the M.2 specification, that one or more slots included in expansion socket 100 (e.g., primary slot 104, secondary slot 106, etc.) may utilize. In this figure, element 302 and element 304 illustrate pinouts for expansion slots (e.g., slots included in expansion sockets) that conform to the "B key" and "M key" edge connector configurations of the M.2 specification. As such, in some embodiments, an edge connector of an expansion card may include pinouts for "B key" and "M key" edge connectors, as illustrated by element 306 and element 308 respectively, which may fit within corresponding M.2-conforming expansion slots as male connectors. Alternatively, one or more of the plurality of slots included in expansion socket 100 may receive edge connectors and/or pinouts that conform to the "B & M key" hybrid edge connector configuration of the M.2 specification, as illustrated by element 310. As further discussed above, each of these example pinouts may be more compact than the pinout specified by the PCI EXPRESS computing bus specification to which an M.2 expansion card may be coupled and over which an M.2 expansion card may communicate when inserted into a suitably configured expansion socket.

Figure 4:
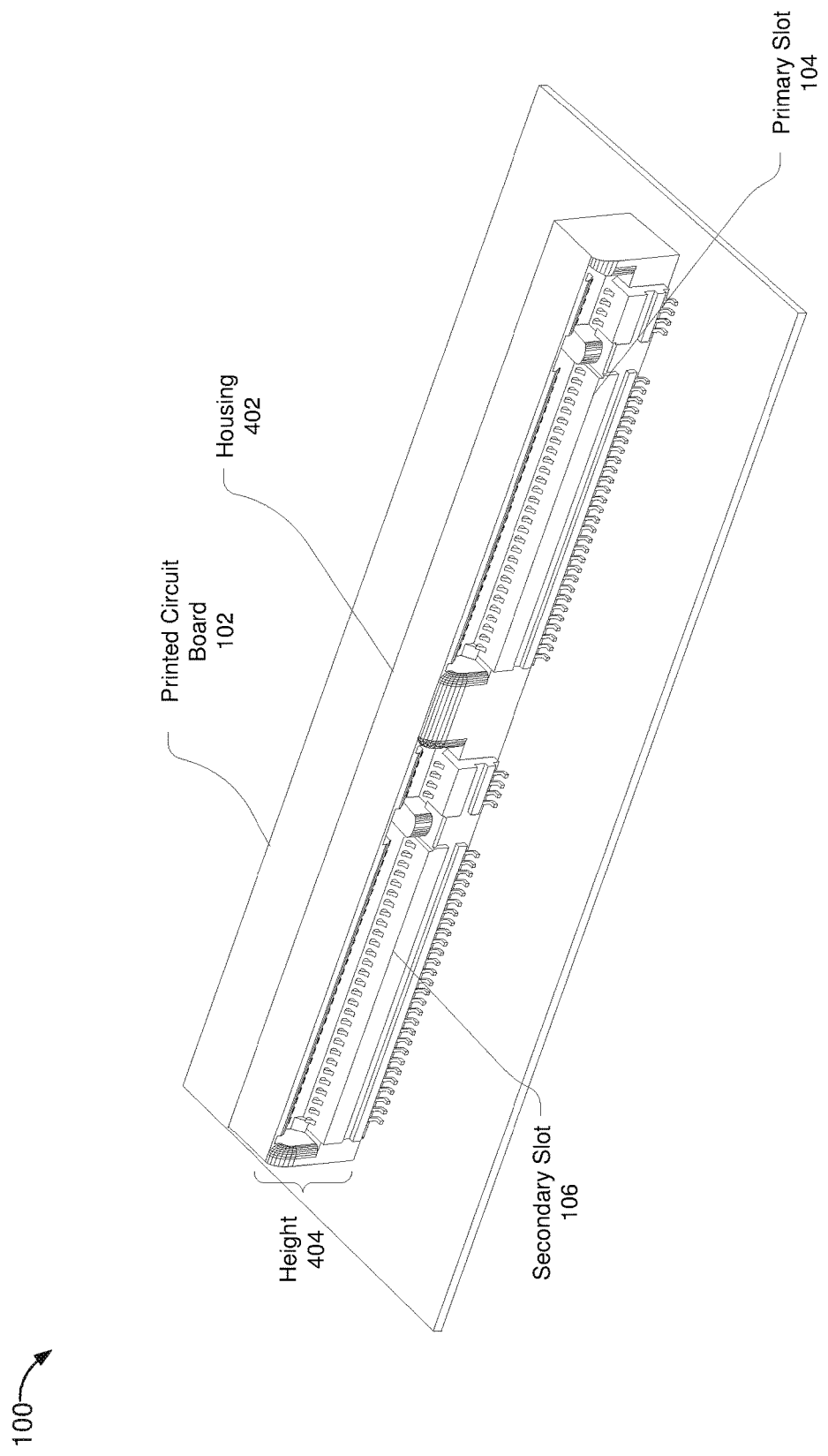
FIG. 4 is a perspective view of an example expansion socket having a dual compact form factor.

FIG. 4 includes a perspective view 400 of an example expansion socket 100 that includes two expansion slots (e.g., primary slot 104 and secondary slot 106). Expansion socket 100 may be formed in a variety of shapes and sizes. In one example, expansion socket 100 may include a housing 402 that defines, joins, and/or divides the expansion slots included in expansion socket 100. In some embodiments, housing 402 may include one or more alignment features, in addition to alignment features included in respective expansion slots (e.g., primary slot 104 and/or secondary slot 106), that may facilitate alignment and/or insertion of an expansion card into either or both of primary slot 104 and/or secondary slot 106 (e.g., one or more alignment keys, alignment guides, alignment pins, etc.).

In one embodiment, expansion socket 100 may be configured to receive a corresponding dual-compact-form-factor expansion card, which may be dimensioned to be inserted into expansion socket 100. In the configuration shown in FIG. 4, the slots included in expansion socket 100 may be oriented relative to receiver printed circuit board 102 such that a plane defined by an expansion card inserted into the slots may be generally parallel to a plane defined by receiver printed circuit board 102. Therefore, as will be shown in FIGS. 8A-8C, a dual-compact-form-factor expansion card inserted into expansion socket 100 may extend away from expansion socket 100 in a plane that may be generally parallel to a plane defined by receiver printed circuit board 102. Furthermore, in some examples, expansion socket 100 may terminate conductors at the edge of a printed circuit board (e.g., conductors included in an edge connector) while bringing the terminations (e.g., female contacts included in a slot) out at right angles to the plane of the conductors of receiver printed circuit board 102. Hence, in this example, expansion socket 100 may be configured as a right-angle connector.

As also shown in FIG. 4, primary slot 104 and secondary slot 106 may include a height dimension 404 ("height 404"). In some examples, height 404 may represent a distance from a top edge of expansion socket 100 to a face of receiver printed circuit board 102, and may be referred to as a "stack height" of expansion socket 100. In at least one embodiment, height 404 may be selected (e.g., by a designer of a system that included expansion socket 100) to be sufficient to accommodate a heat sink coupled to an expansion card when an edge connector of the expansion card is inserted into expansion socket 100 (e.g., when primary portion 204 is inserted into primary slot 104 and secondary portion 206 is inserted into secondary slot 106). As an example, the height dimension may be at least 6.7 mm±0.13 mm. In other examples, the height dimension may be any height as may suit a particular application.

Expansion socket 100 may be configured to provide, via each of primary slot 104 and secondary slot 106, interfaces to an expansion card for a variety of computer buses, such as PCI EXPRESS 3.0 (up to, e.g., four lanes), SERIAL ATA 3.0, USB 3.0, and/or any other suitable interface. In some examples, as mentioned above, each of primary slot 104 and secondary slot 106 may have keying notches (such as those illustrated in FIGS. 1-4) that denote the various purposes and capabilities of the slot to prevent plugging an expansion card into a feature-incompatible slot. For example, each of primary slot 104 and secondary slot 106 may, when designed to conform to the M.2 specification, provide a 75-position female connector dimensioned and keyed for SATA or two PCI EXPRESS lanes (PCIe x2) (according to a "socket 2 configuration") or keyed for four PCI EXPRESS lanes (PCIe x4) (according to the "socket 3 configuration").

Each slot included in expansion socket 100 may also, in addition to supporting legacy Advanced Host Controller Interface (AHCI) at the logical interface level, may also support NVM EXPRESS (NVMe) as a logical device interface. While the support for AHCI may ensure software-level backward compatibility with legacy SATA devices and legacy operating systems, NVM EXPRESS may also enable an expansion card to fully utilize the capability of high-speed PCI EXPRESS devices to perform many I/O operations in parallel.

Each slot included in expansion socket 100 may also expose a variety of computing buses, including PCI EXPRESS 3.0, Serial ATA (SATA) 3.0, and USB 3.0. In some examples, expansion socket 100 may provide up to four PCI EXPRESS lanes and one logical SATA 3.0 (6 Gbit/s) port, exposing the same through the same connector so that both PCI EXPRESS and SATA devices may exist on a received expansion card. By exposing PCI EXPRESS lanes in this manner, expansion socket 100 may provide a pure PCI EXPRESS connection between the host computing device and a hosted expansion card, with no additional layers of bus abstraction.

The pinouts shown in FIGS. 1-4 are merely illustrative. The following table provides a more detailed overview of potential keying and provided interfaces that expansion socket 100 may utilize:

| Key ID | ID Notched Pins | Provided Interfaces |
|---|---|---|
| A | 8-15 | PCIe ×2, USB 2.0, I2C, and DP ×4 |
| B | 12-19 | PCIe ×2, SATA, USB 2.0, and 3.0, audio, UIM, HSIC, SSIC, I2C, and SMBus |
| C | 16-23 | Reserved for future use |
| D | 20-27 | Reserved for future use |
| E | 24-31 | PCIe ×2, USB 2.0, I2C, SDIO, UART, and PCM "WiFi/Bluetooth cards" |
| F | 28-35 | Future Memory Interface (FMI) |
| G | 39-46 | Reserved for custom use (unused in the M.2 specification) |
| H | 43-50 | Reserved for future use |
| J | 47-54 | Reserved for future use |
| K | 51-58 | Reserved for future use |
| L | 55-62 | Reserved for future use |
| M | 59-66 | PCIe ×4, SATA, and SMBus |

Additionally, the following table indicates potential component thicknesses for an example expansion card that may be received by a dual-compact-form-factor expansion socket:

| Type ID | Top Side | Bottom Side |
|---|---|---|
| S1 | 1.20 mm | N/A |
| S2 | 1.35 mm | N/A |
| S3 | 1.50 mm | N/A |
| D1 | 1.20 mm | 1.35 mm |
| D2 | 1.35 mm | 1.35 mm |
| D3 | 1.50 mm | 1.35 mm |
| D4 | 1.50 mm | 0.70 mm |
| D5 | 1.50 mm | 1.50 mm |

Figure 5:
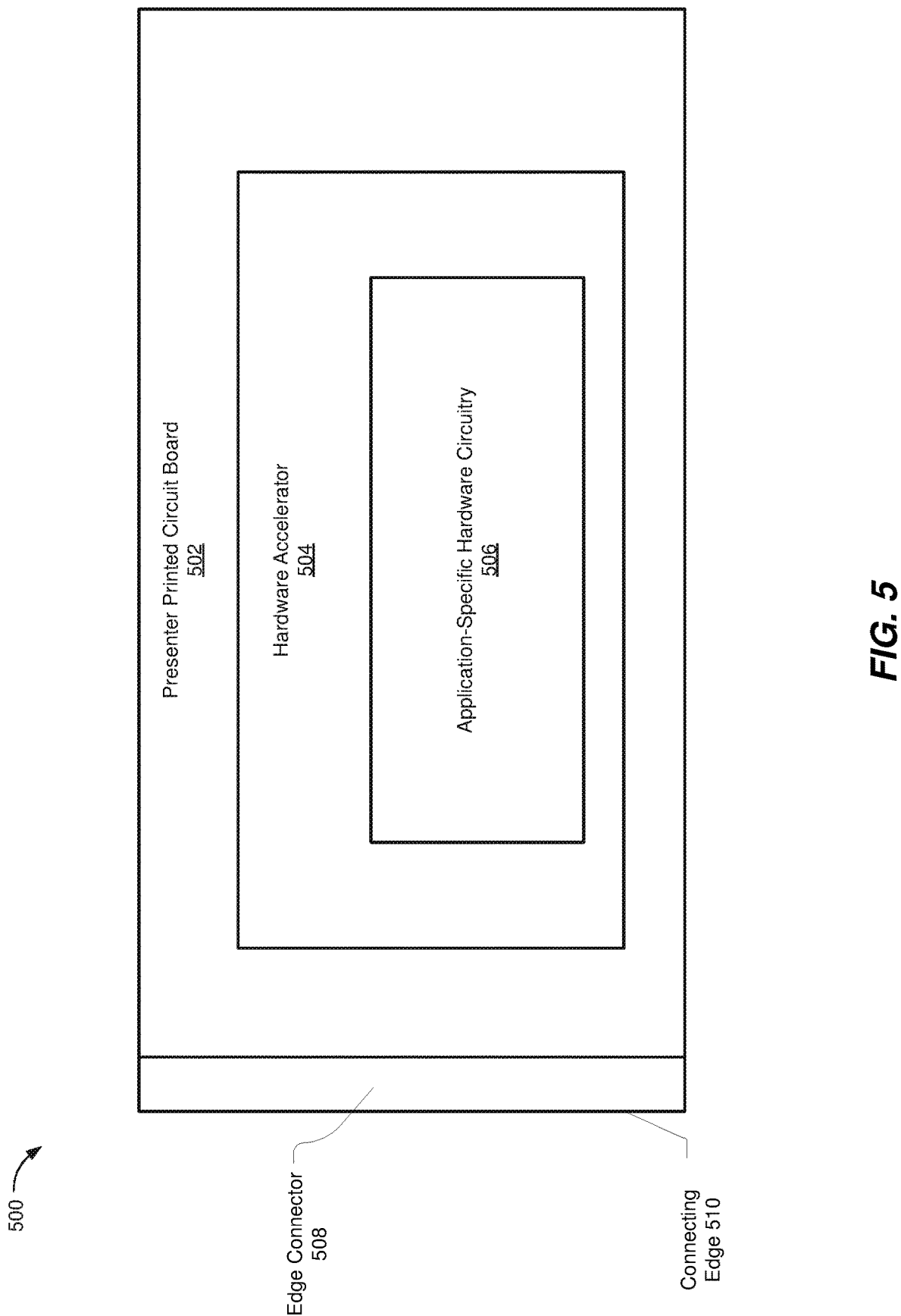
FIG. 5 is a block diagram of an example expansion card that may be capable of performing hardware acceleration when integrated into a computing system via an expansion socket as described herein.

As described above, expansion socket 100 may integrate hardware accelerators into a computing system by receiving and electrically coupling to a dual-compact-form-factor expansion card that may include a hardware accelerator. FIG. 5 is a block diagram of an example dual-compact-form-factor expansion card 500 ("expansion card 500") capable of performing hardware acceleration according to the systems and methods disclosed herein. As shown in this figure, expansion card 500 may include printed circuit board 502 and one or more components disposed on printed circuit board 502.

As shown in FIG. 5, expansion card 500 may include a hardware accelerator 504 disposed on printed circuit board 502. A "hardware accelerator" may include a hardware component or device that performs one or more specialized computing tasks more efficiently, in hardware, than the computing task would be performed in software by a general purpose central processing unit (i.e., a computing chip that is structured to execute a range of different programs as software). In some examples, "hardware acceleration" may include the execution of a computing task in application-specific hardware circuitry that occurs in the absence of a software module intermediary or other layer of abstraction, such that the performance of the application is more efficient (e.g., in terms of computing resources, electrical resources, etc.) than when executed otherwise.

In one example, hardware accelerator 504 may include application-specific hardware circuitry 506 designed to perform a specific computing task. In this example, hardware accelerator 504 may be designed to offload a portion of the specific computing task from a central processing unit of a computing device, such as a data center server, by executing, via application-specific hardware circuitry 506, at least a portion of the specific computing task. In some examples, to "offload a portion of the computing task from a central processing unit of a computing device" may include performing the computing task through the hardware accelerator rather than performing the computing task through a general purpose central processing unit (i.e., a central processing unit of the computing device to which expansion card 500 is coupled, or another central processing unit that might otherwise perform the computing task in the absence of expansion card 500).

Additionally, expansion card 500 may also include an edge connector 508, disposed on a connecting edge 510 of presenter printed circuit board 502, that is dimensioned to be inserted into a suitably configured expansion socket of a computing device. In some examples, edge connector 508 may be configured similarly to edge connector 200 described above. In one example, edge connector 508, when hosted within expansion socket 100, may couple hardware accelerator 504 to the central processing unit of the computing device via a computing bus connected to the expansion socket. In some examples, as described above, an edge connector included in a dual-compact-form-factor expansion card (e.g., expansion card 500) may include a plurality (e.g., two or more) of pinouts, each disposed in a different portion of the edge connector. Each pinout may conform to a compact pinout specification.

As detailed above, hardware accelerator 504 of expansion card 500 may be customized or special-purpose designed to perform, in hardware, one or more specific computing tasks. Illustrative examples of the types of specific computing tasks or applications that hardware accelerator 504 of expansion card 500 may execute or perform include, without limitation, artificial intelligence and/or machine learning training (e.g., model construction, inference, flasher labeling, etc.), video transcoding (e.g., converting video data from one encoded format to an intermediate uncompressed format and then converting the intermediate uncompressed format to another encoded format or target format), video processing (e.g., combining two or more video streams into a single video stream or a fewer number of video streams), data encryption/decryption, data compression/decompression, etc. In some examples, hardware accelerator 504 of expansion card 500 may be especially suited to, or beneficial for, the performance of specific types of mathematical operations, which may include multiply-accumulate operations, linear algebra operations, machine learning or vector tuning operations, and/or cryptographic prime number identification and/or verification operations. In general, hardware accelerator 504 of expansion card 500 may be customized or special-purpose designed to perform, in hardware, any type or form of computation-intensive computing task to thereby alleviate a burden on one or more general-purpose central processing units (i.e., by performing the computing task on a separate chip than the central processing unit and/or by performing the computing task more efficiently in hardware than in software).

As indicated above, in some examples, the computing task that application-specific hardware circuitry 506 of hardware accelerator 504 is designed to perform may include an artificial intelligence inference task that applies a model trained on known data to infer at least one label for new data. In some examples, an "artificial intelligence inference task that applies a model trained on known data" may include a process of applying a trained model to new data (e.g., making one or more predictions regarding the new data based on the model) rather than the process of generating, training, and/or tuning the model. In some examples, hardware accelerator 504 of expansion card 500 may effectively label one or more items of newly encountered, or newly analyzed, data with a label or attribute. In general, the model may be generated, trained, and/or tuned based on previously encountered data that was partially, or entirely, labeled, thereby enabling a machine learning algorithm to predict one or more labels for future data (e.g., by detecting patterns in the labels of the previously encountered data).

In some embodiments, the artificial intelligence inference task may include a user attribute inference task in the context of an online social networking system. In these examples, the user attribute may include an interest, a recommendation (e.g., an advertisement recommendation and/or a friend recommendation), and/or a push notification (e.g., a social network post selected for the user's newsfeed). In general, the artificial intelligence inference task may identify one or more of these labels or attributes for a user based on one or more items of data and/or metadata associated with the user, including the user's post history, post content, social media "likes" or response icon selections, friends list, message history, message content, and/or selected or clicked items such as including items and/or advertisements. In general, the artificial intelligence inference task may infer, or predict, that a user with one set of data or metadata will tend to share a label with another user having a similar or identical set of data or metadata (e.g., the strength of the prediction may be proportional to the similarity between the two users' items of data/metadata).

Hardware accelerator 504 may take a variety of forms. Illustrative examples of hardware accelerators include, without limitation, graphics processing units, cryptographic accelerators, video processing units, artificial intelligence accelerators, coprocessors, digital signal processors, and/or public key encryption accelerators. In some examples, hardware accelerator 504 may be implemented via an application specific integrated circuit (ASIC) and/or a field-programmable gate array (FPGA).

Figure 6:
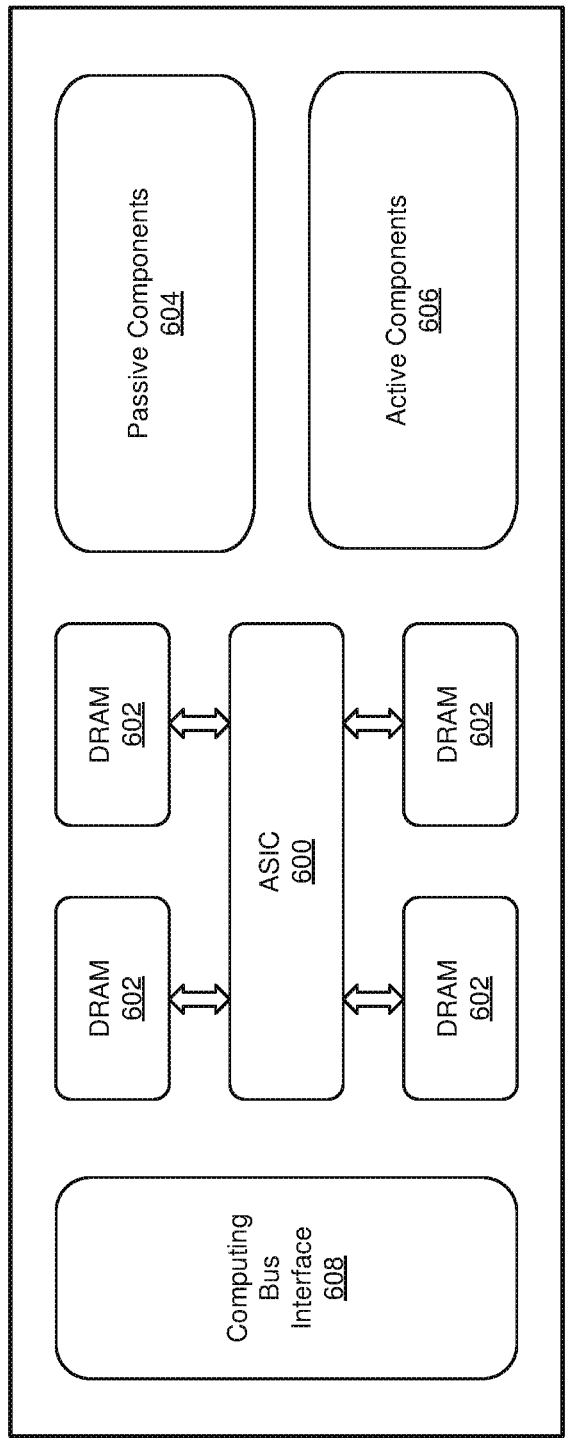
FIG. 6 is a more specific block diagram of an example expansion card capable of performing hardware acceleration when integrated into a computing system via an expansion socket as described herein.

FIG. 6 shows a block diagram of a more specific example of expansion card 500. As shown in this figure, expansion card 500 may include a hardware accelerator in the form of an ASIC 600. As further shown in this figure, expansion card 500 may also include one or more instances of dynamic random-access memory (DRAM) 602, each of which may be coupled to hardware accelerator 504. Expansion card 500 may also include one or more passive components 604, including resistors, capacitors, inductors, and/or transistors. Additionally, or alternatively, expansion card 500 may also include one or more active components 606. Each of the passive components and/or active components may be specifically designed and/or placed on expansion card 500 in a configuration that executes or performs (and/or enables ASIC 600 to perform), in hardware, the specific application in question, such as the video transcoding and/or artificial intelligence inference tasks described above. Lastly, expansion card 500 may also include a computing bus interface 608, such as a PCI EXPRESS interface, which may translate data formatted by ASIC 600 for transmission across the edge connector and/or the computing bus to which expansion card 500 may be coupled.

As detailed above, edge connector 508 of expansion card 500 may include a plurality of pinouts, each disposed within a different portion (e.g., a distinct and/or separate linear portion) of edge connector 508. Each pinout may conform to one or more mixed-pin pinout specifications, such as the M.2 specification as described above in reference to FIG. 3.

Figure 7:
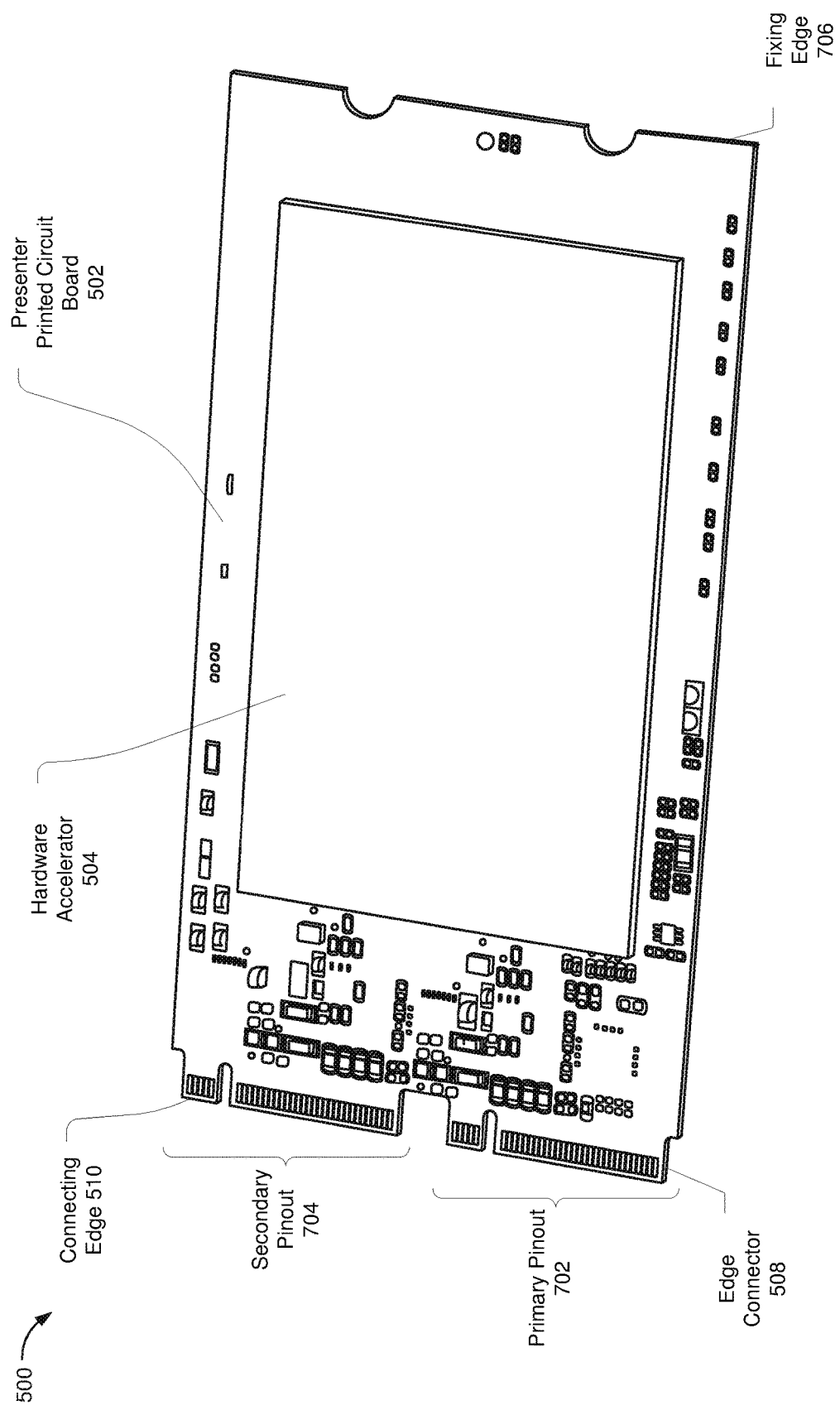
FIG. 7 is a perspective view of an example dual-compact-form-factor expansion card as described herein.

FIG. 7 includes a perspective view 700 of an example dual-compact-form-factor expansion card 500 that includes an edge connector 508, disposed on a connecting edge 510, and a hardware accelerator 504. Expansion card 500 may be formed in a variety of shapes and sizes. In one example, expansion card 500 may be substantially rectangular in shape, with an edge connector 508 disposed on a connecting edge 510 of printed circuit board 502 and a plurality of semicircular fixing notches (e.g., mounting holes) defined by a fixing edge 706 that may be an edge of printed circuit board 502 that may be opposite to connecting edge 510. As shown in this view, edge connector 508 may include a primary pinout 702 disposed within a primary portion of edge connector 508 and a secondary pinout 704 disposed within a secondary portion of edge connector 508. In one embodiment, expansion card 500 may be dimensioned to be inserted into a corresponding dual-compact-form-factor expansion socket (such as expansion socket 802 in FIGS. 8A-8C).

In some examples, as mentioned above, dual-compact-form-factor expansion card may aggregate resources provided via separate slots included in a dual-compact-form-factor expansion socket in order to accommodate components that may require more resources than may be provided via a single slot or via traditional compact-form-factor expansion socket (e.g., an M.2 expansion socket). For example, a traditional M.2 expansion socket may provide 3.3 volts to a traditional M.2 expansion card. Conversely, an example hardware accelerator may require 6 volts to function. The voltage provided by the traditional M.2 expansion socket would be insufficient for the example hardware accelerator. However, if such an example hardware accelerator were included in expansion card 500, and expansion card 500 was inserted into an expansion socket 100, expansion card 500 could receive 3.3 volts from each of primary slot 104 via primary pinout 702 and 3.3 volts from secondary slot 106 via secondary pinout 704. Expansion card 500 could then aggregate the received voltages for an aggregated total voltage of up to 6.6 volts, which may be sufficient for the example hardware accelerator to function. Similarly, expansion card 500 may additionally or alternatively aggregate bandwidth and other resources provided and/or exposed to expansion card 500 by primary slot 104 and secondary slot 106.

Figure 8A:
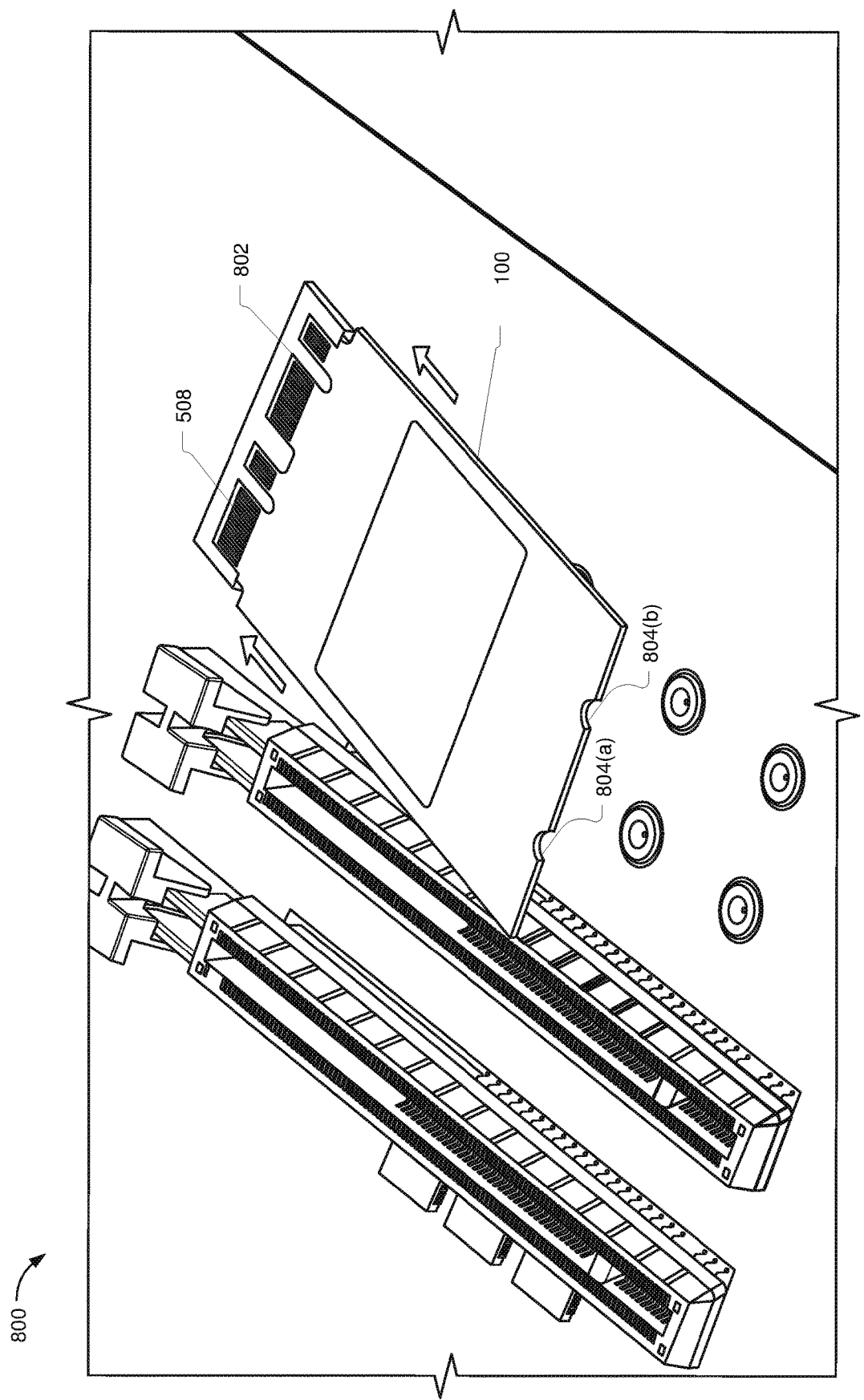
FIG. 8A is a perspective view of an initial stage of a process for inserting an example dual-compact-form-factor expansion card into a corresponding dual-compact-form-factor expansion socket.
Figure 8B:
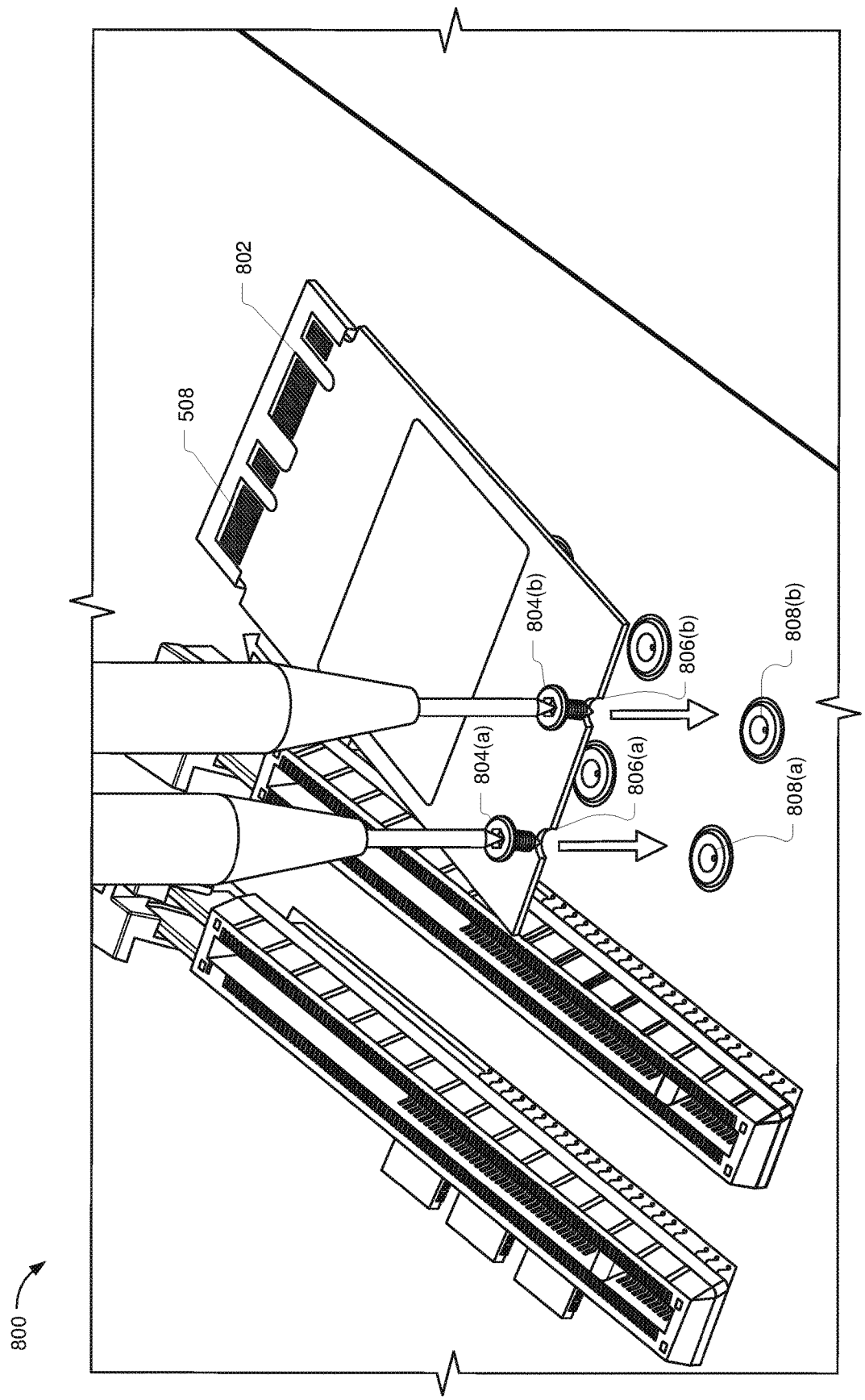
FIG. 8B is a perspective view of an intermediate stage of the process for inserting the example dual-compact-form-factor expansion card into the corresponding dual-compact-form-factor expansion socket.
Figure 8C:
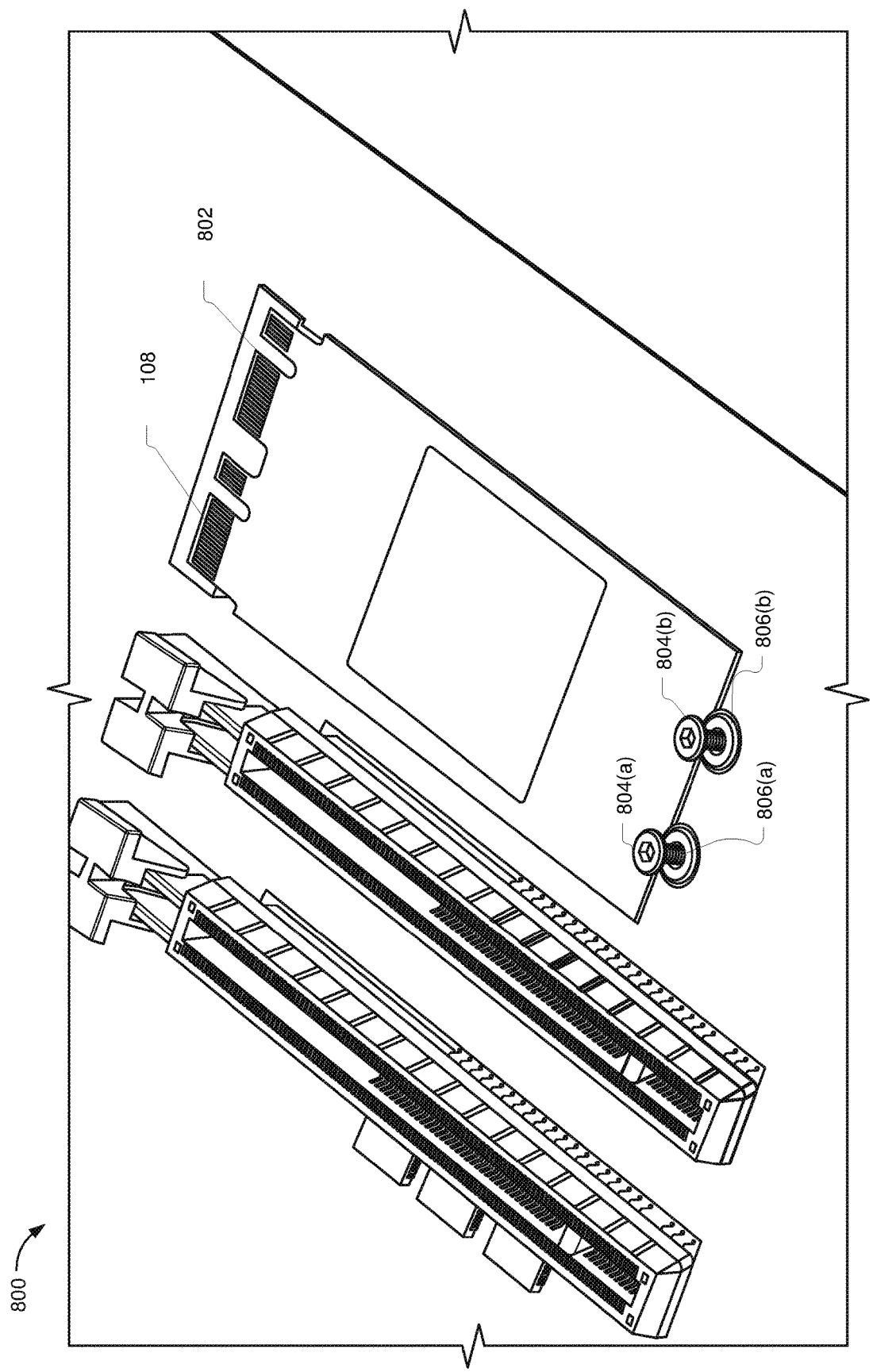
FIG. 8C is a perspective view of a concluding stage of the process for inserting the example dual-compact-form-factor expansion card into the corresponding dual-compact-form-factor expansion socket.

As detailed above, expansion card 500 may be dimensioned to be inserted into a corresponding dual-compact-form-factor expansion socket provided by a host circuit board. FIGS. 8A-8C illustrate three separate stages (i.e., beginning, middle, and ending) of a process for inserting, or coupling, expansion card 500 with a corresponding dual-compact-form-factor expansion socket 802 on a motherboard 800. As shown in FIG. 8A, a user or machine may first align edge connector 508 of expansion card 500 with dual-compact-form-factor expansion socket 802. The user or machine may then push expansion card 500 such that edge connector 508 fits within dual-compact-form-factor expansion socket 802. Next, as shown in FIG. 8B, the user or machine may align screw 804(a) with a fixing notch 806(a)

and then twist screw 804(*a*) through fixing notch 806(*a*) and into a corresponding primary screw hole 808(*a*) beside dual-compact-form-factor expansion socket 802. As further shown in FIG. 8B, the user or machine may also align screw 804(*b*) with secondary fixing notch 806(*b*) and then twist screw 804(*b*) through secondary fixing notch 806(*b*) and into a corresponding secondary screw hole 808(*b*) beside dual-compact-form-factor expansion socket 802. Thus, a user or machine may fasten expansion card 500 into dual-compact-form-factor expansion socket 802. FIG. 8C illustrates an example of the final position of expansion card 500 after the fastening process is complete.

Hence, expansion socket 100 may provide, and dual-compact-form-factor expansion cards may simultaneously receive and/or utilize, resources (e.g., electrical resources, bandwidth resources, logical resources, etc.) provided by a plurality of slots included in expansion socket 100. Such dual-compact-form-factor expansion cards may therefore host hardware accelerators that may require or that may utilize more resources than hardware accelerators that may be included in traditional compact-form-factor expansion cards (e.g., traditional M.2 hardware accelerators).

As an alternative to receiving a dual-compact-form-factor expansion card (e.g., expansion card 500), a dual-compact-form-factor expansion socket may receive traditional compact-form-factor expansion cards whose pinouts conform to a complementary compact pinout specification. For example, if a slot included in a dual-compact-form-factor expansion socket is configured to receive an M-key pinout, the slot may receive, at a time that the dual-compact-form-factor expansion socket is not receiving a dual-compact-form-factor expansion card, a traditional compact-form-factor expansion card that includes a M-key pinout. As each dual-compact-form-factor expansion socket may include a plurality of slots, each expansion socket may, instead of receiving one dual-compact-form-factor expansion card, receive one or more traditional compact-form-factor expansion cards. As some traditional compact-form-factor expansion cards may also include hardware accelerators, a dual-compact-form-factor expansion socket as described herein may also integrate such hardware accelerators (e.g., hardware accelerators included in traditional compact-form-factor expansion cards, such as M.2 expansion cards) into computing systems.

Figure 9:
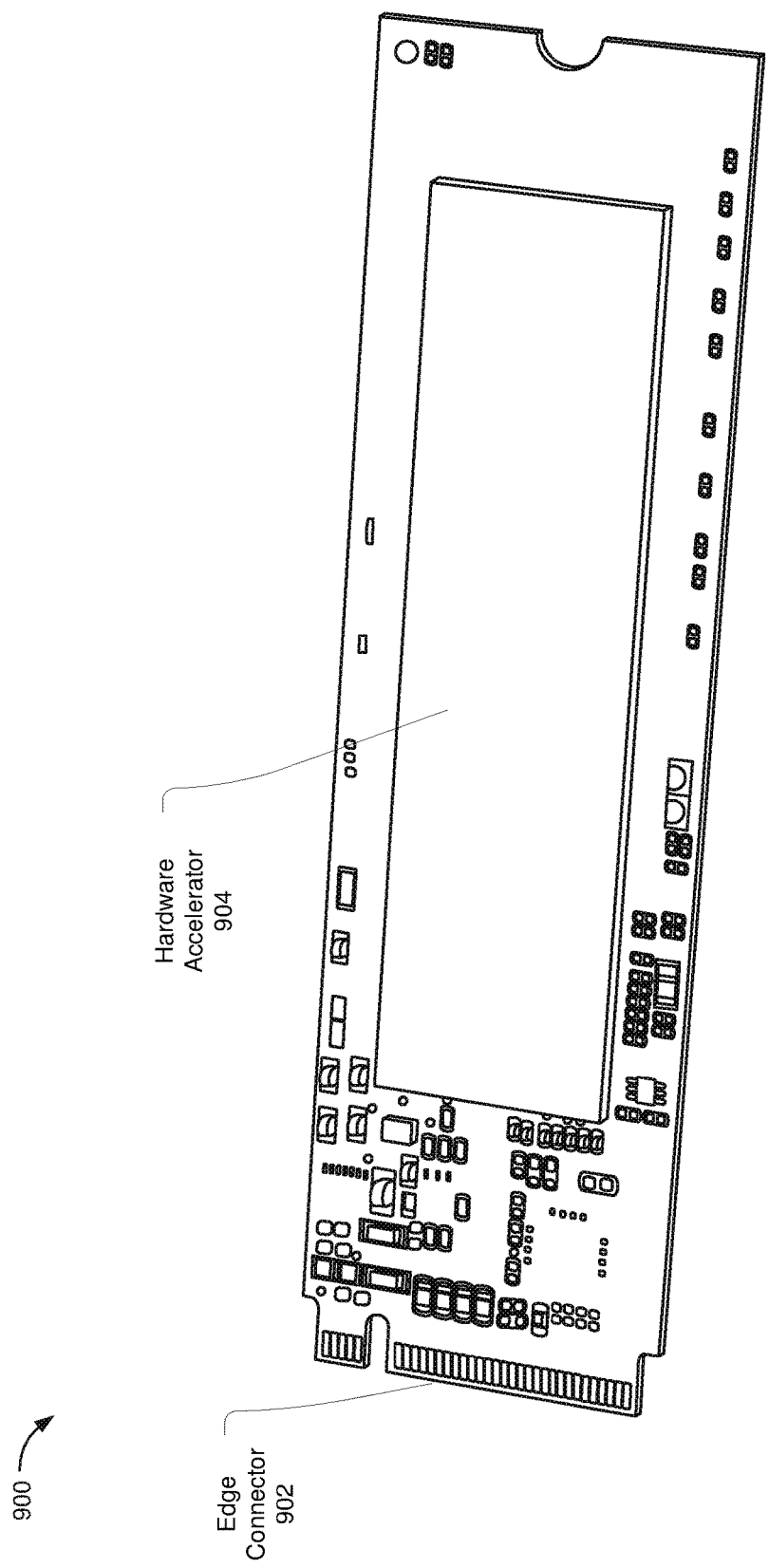
FIG. 9 is a perspective view of an example traditional compact-form-factor expansion card.

FIG. 9 is a perspective view of an example traditional compact-form-factor expansion card 900 ("expansion card 900") that includes an edge connector 902 and a hardware accelerator 904. As shown, expansion card 900 is configured in accordance with an M-key pinout specification of an M.2 compact expansion card specification. Therefore, edge connector 902 may be received by any slot of a dual-compact-form-factor expansion socket configured to receive a pinout that conforms to those specifications (e.g., either of primary slot 104 and/or secondary slot 106 included in expansion socket 100). Note that expansion card 900 is merely illustrative. Other traditional compact-form-factor expansion cards may conform to other compact pinout specifications and/or other compact expansion card specifications.

In contrast to hardware accelerator 504 included in expansion card 500, hardware accelerator 904 may only be provided with resources (e.g., electrical resources, bandwidth resources, logical resources, etc.) via a single compact expansion slot (e.g., an expansion slot configured to receive pinouts that conform to the M-key pinout specification). Because of these limitations, hardware accelerator 904, while still capable of accelerating complex computational tasks, may be less effective at doing so than hardware accelerator 504.

In some examples, expansion socket 100 may constitute one part of a larger system. For example, expansion socket 100 may be included in a computing device that represents, either alone or in combination with other computing devices or components, part of a larger system. In some examples, this computing device may include a central processing unit. In these examples, expansion socket 100 may aid in ameliorating a burden on the central processing unit of the computing device by integrating a hardware accelerator that may execute a computing task in hardware, which may relieve the central processing unit from executing the computing task in software, as outlined above. In some examples, the computing device may also include a memory device, which may provide a location for storing and loading corresponding software.

In some alternative examples, the computing device that expansion socket 100 may be included in may not include a conventional central processing unit. For example, this computing device may simply include a chassis that houses a rack of trays dimensioned to receive dual-compact-form-factor expansion cards and including one or more dual-compact-form-factor expansion sockets. The computing device may receive, via a dual-compact-form-factor expansion socket (e.g., expansion socket 100), one or more expansion cards that may include a hardware accelerator, such as expansion card 500 and/or expansion card 900. The computing device may then provide results from the hardware accelerator across a network to which the computing device is connected. Additionally, in some examples, the hardware accelerator may effectively replace a central processing unit or coprocessor that was previously inserted into the computing device.

In general, the computing device of the above-described system may correspond to one of a variety of different devices, such as laptops, desktops, servers, etc. In examples where the computing device represents a server, the computing device may be disposed, or located, within a data center, which may provide computational resources to users, clients, or other servers across a computing network (e.g., a wide area network). For example, the above-described system may represent a backend data center of a corporate networking enterprise that provides at least one online service to corresponding users of client devices. This online service may include a social networking service, a virtual reality service, and/or a cloud storage service. In the context of a social networking service, the specific application performed by hardware accelerator 504 and/or hardware accelerator 904 may include any of the specific computing tasks described above, such as artificial intelligence inference tasks (e.g., applying a machine learning model to predict a post, interest, friend, recommendation, and/or advertisement for a user) and/or video transcoding (e.g., encoding and/or decoding) operations.

In one specific example, the computing device into which expansion card 500 and/or expansion card 900 is inserted may represent a domain controller server and/or an edge server. As used herein, the term "domain controller" generally refers to a server that manages a unified collection of computing resources. Additionally, the term "domain controller" may refer to a main server or primary server of a technology company data center, which may be prioritized for the processing of one or more computing tasks. In addition, as used herein, the term "edge server" generally refers to a server that resides on the "edge" between two networks. In some illustrative examples, the edge server may reside between a private network and the Internet. In some examples, an "edge server" may refer to a computing device that has fewer computing resources and/or lower computational processing power than a domain controller or main/primary server. In some examples, it may be impractical or impossible for an edge server to perform a computationally expensive computing task, such as an artificial intelligence inference task and/or a video transcoding task, without executing the computing task through a hardware accelerator, such as hardware accelerator 504 on expansion card 500, as discussed above. In other words, inserting a hardware accelerator card, such as expansion card 500 and/or expansion card 900, into a dual-compact-form-factor expansion socket included in an edge server may enable the edge server to perform the complex computational task, thereby converting the edge server from a system that is unable to efficiently or effectively perform a complex task into a system that is able to reliably handle the complex task.

In some embodiments, the computing device that may include expansion socket 100 and that may receive expansion card 500 and/or expansion card 900 may represent a multi-node compute platform. In one example, this multi-node compute platform may include a sled, which may further include one or more modular computing devices (such as a server card or a storage carrier card). In this example, one or more of the server or carrier cards may include at least one dual-compact-form-factor expansion socket that is dimensioned to accept expansion card 500 (and thus may also be dimensioned to accept at least one expansion card 900) and that may be re-purposed for hardware acceleration, as discussed further below.

Figure 10:
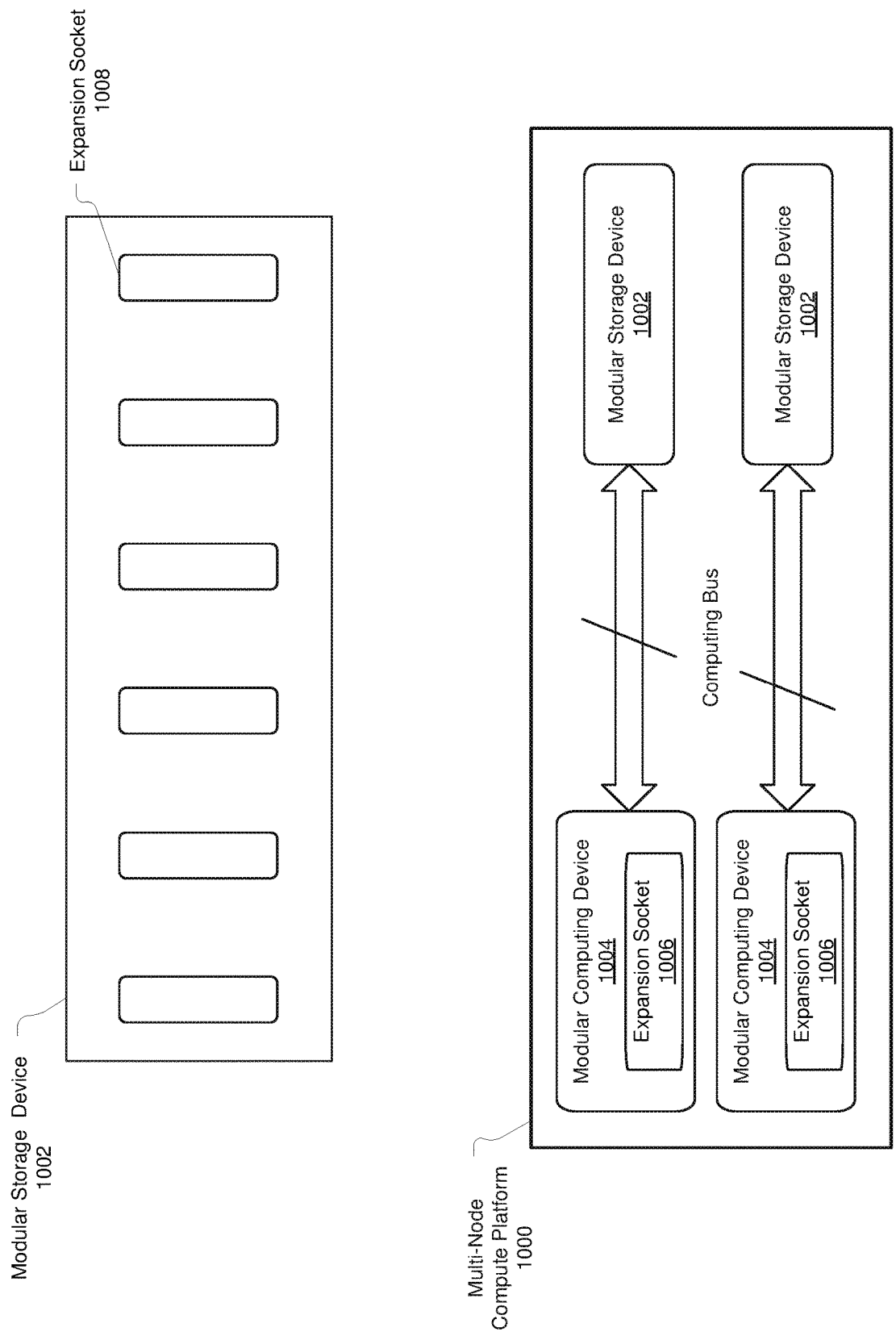
FIG. 10 is a block diagram of an example multi-node compute platform that may include dual-compact-form-factor expansion sockets as described herein.

FIG. 10 is a block diagram of an exemplary multi-node compute platform 1000 that may be partially or entirely purposed or re-purposed for hardware acceleration. As shown in FIG. 10, multi-node compute platform 1000 may be configured with several bays, each of which may house a modular storage device 1002 (e.g., an SSD carrier card or a device carrier card), a modular computing device 1004 (e.g., a micro-server card), and/or any other suitable type or form of modular node. While FIG. 10 shows multi-node compute platform 1000 with four bays, multi-node compute platforms may include any other number of bays.

Re-purposing a multi-node compute platform for hardware acceleration may involve inserting one or more hardware accelerator expansion cards into a suitably configured expansion slot within the multi-node compute platform. In the example shown in FIG. 10, expansion sockets 1006 may be dual-compact-form-factor expansion sockets. Therefore, hardware-accelerator expansion cards (such as expansion card 500 or expansion card 900) may be inserted into either or both of expansion sockets 1006 of modular computing devices 1004. Additionally or alternatively, hardware-accelerator expansion cards may be inserted into one or more of dual-compact-form-factor expansion sockets 1008 in either or both of modular storage devices 1002.

By integrating dual-compact-form-factor expansion cards that include hardware accelerator cards into multi-node compute platform 1000 via dual-compact-form-factor expansion sockets as described herein, embodiments of the instant disclosure may supplement multi-node compute platform 1000 with hardware acceleration functionality. Furthermore, dual-compact-form-factor expansion cards as disclosed herein may provide increased resources to hardware accelerators disposed thereon versus traditional compact-form-factor expansion cards, and may therefore provide improved hardware acceleration functionality over such traditional compact-form-factor expansion cards. Additionally, because dual-compact-form-factor expansion sockets as described herein may accept either dual-compact-form-factor expansion cards or traditional compact-form-factor expansion cards, such expansion sockets may enable granular scaling of hardware acceleration resources and/or flexible balancing of resources among hardware acceleration, storage, and/or other capabilities that may be provided via such expansion cards. Hence, the disclosed systems and methods may enable a data center administrator or automation system to efficiently scale the ability of a multi-node compute platform to handle computationally expensive computing tasks by simply inserting and enabling one or more hardware-acceleration expansion cards into appropriately configured dual-compact-form-factor expansion sockets within the multi-node compute platform.

Figure 11:
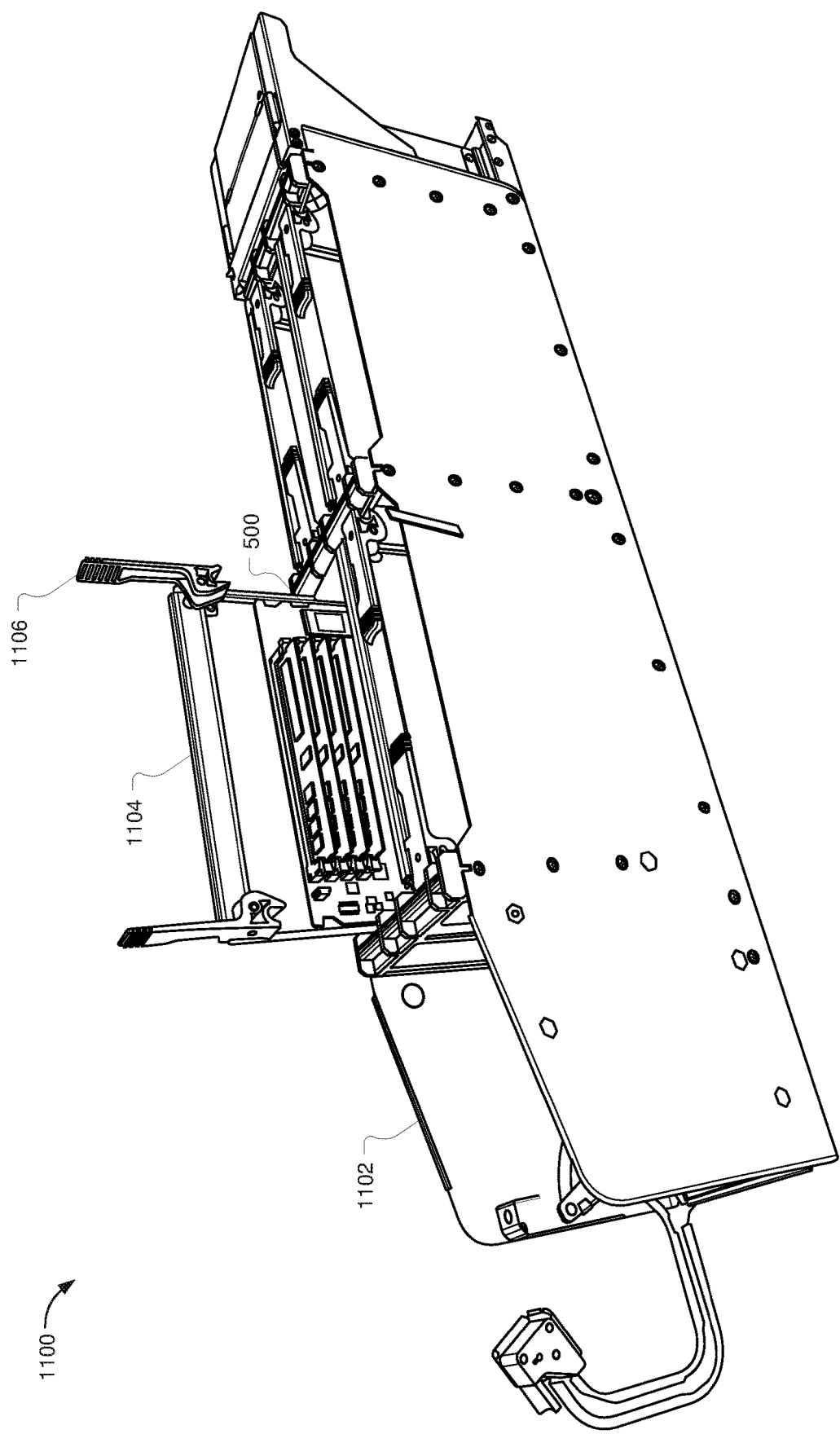
FIG. 11 is a perspective view of an example multi-node compute platform sled that may include dual-compact-form-factor expansion sockets as described herein.

As noted above and illustrated in FIG. 13, a multi-node compute platform 1100 may be dimensioned to accept modular computing devices on one or more sleds, such as sled 1102 in FIG. 11. In this example, sled 1102 may include several bays or slots for accepting corresponding trays 1104, each of which may include a modular computing device (e.g., a server card) or a modular storage device (e.g., a carrier or device card, such as an SSD card). As shown in this figure, sled 1102 may include four separate slots for accepting corresponding trays 1104. Each tray 1104 may include at least one fastening mechanism 1106. FIG. 11 further illustrates how each tray 1104 may hold a modular computing device and/or modular storage device, each of which may include at least one dual-compact-form-factor expansion socket into which an expansion card 500 may be inserted.

Figure 12:
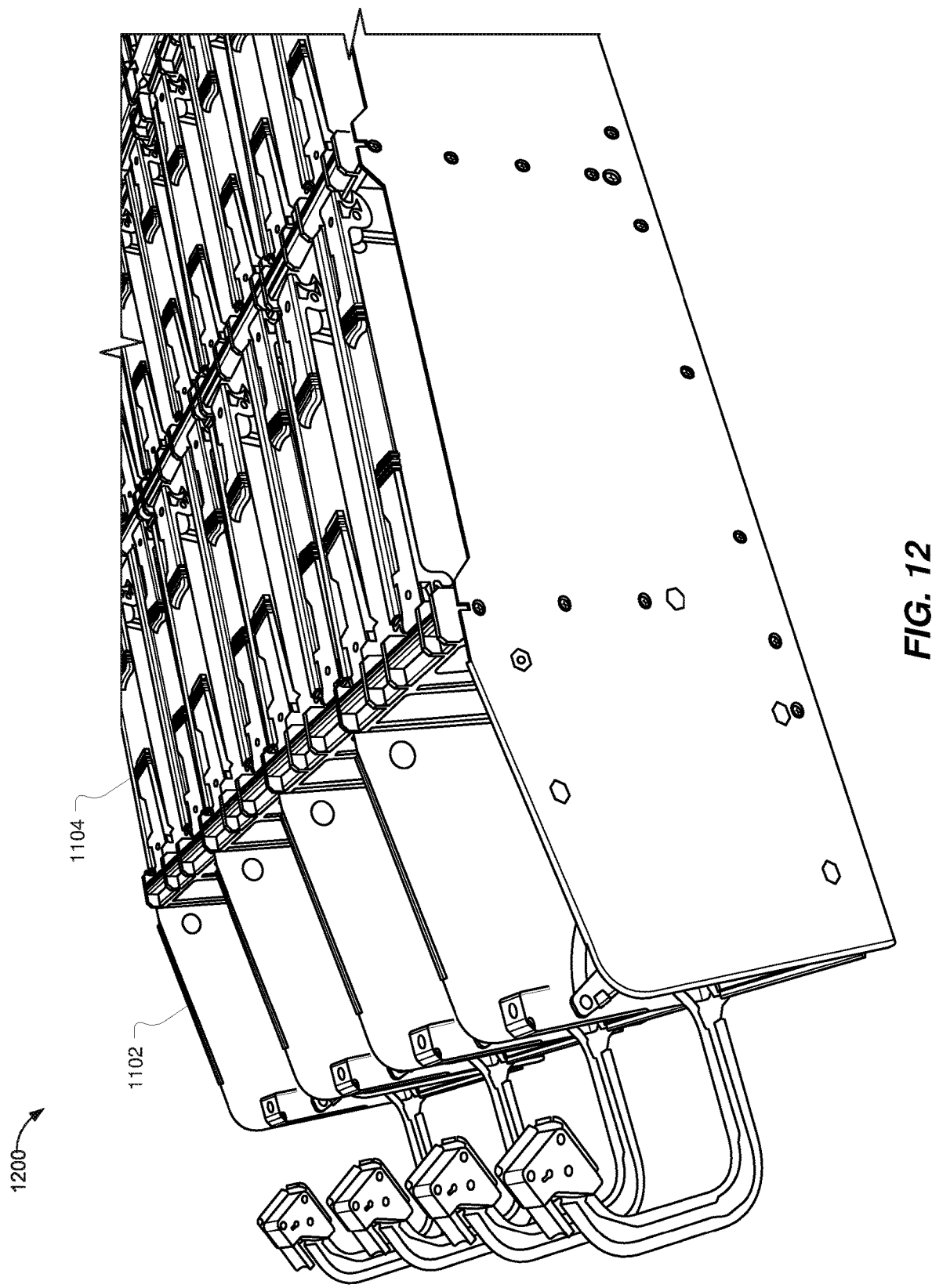
FIG. 12 is a perspective view of an example chassis capable of housing various multi-node compute platform sleds that may include dual-compact-form-factor expansion sockets as described herein.

FIG. 12 is a perspective drawing of an expanded multi-node compute platform 1100. As shown in this figure, platform 1100 may include a set of sleds, such as sled 1102, each of which may accept multiple trays 1104 containing modular computing and/or storage devices. By including dual-compact-form-factor expansion sockets that may receive dual-compact-form-factor expansion cards that include hardware accelerators in these devices, the disclosed systems and methods may facilitate dramatically improved data center scaling (e.g., scaling that may not involve adding expensive servers and/or that may not require additional space in a data center) for computationally expensive computing tasks. More specifically, data center administrators may conveniently scale hardware acceleration resources for complex tasks, such as artificial intelligence inference operations and/or video transcoding operations, by (i) adding one or more expansion cards via a dual-compact-form-factor expansion socket, such as expansion card 500 or expansion card 900, to a single tray (such as tray 1104) that houses a modular computing and/or storage device, (ii) adding additional trays of modular computing or storage devices to a sled (such as sled 1102), each of which may include one or more instances of expansion card 500 and/or expansion card 900, (iii) adding additional sleds (such as modular storage device 1002) to a chassis, each of which may contain additional instances of expansion card 500 and/or expansion card 900, and/or (iv) adding additional chassis and/or server racks, each of which may accept multiple sleds that contain additional instances of expansion card 500 and/or expansion card 900.

In this manner, the disclosed systems and methods may re-purpose or re-engineer a multi-node compute platform, and more specifically may re-engineer a modular computing and/or storage device, which previously may have been used exclusively for mass storage via solid-state drives, to supplement the platform with one or more hardware accelerators. Multi-node compute platforms that are configured in this manner (e.g., that include dual-compact-form-factor expansion sockets) may benefit from the granular scalability provided by dual-compact-form-factor or traditional compact-form-factor expansion cards that include hardware accelerators. Additionally, the form factors of such expansion cards may enable a larger number of expansion sockets within the same surface area in comparison to a traditional expansion card such as a PCI EXPRESS expansion card.

Figure 13:
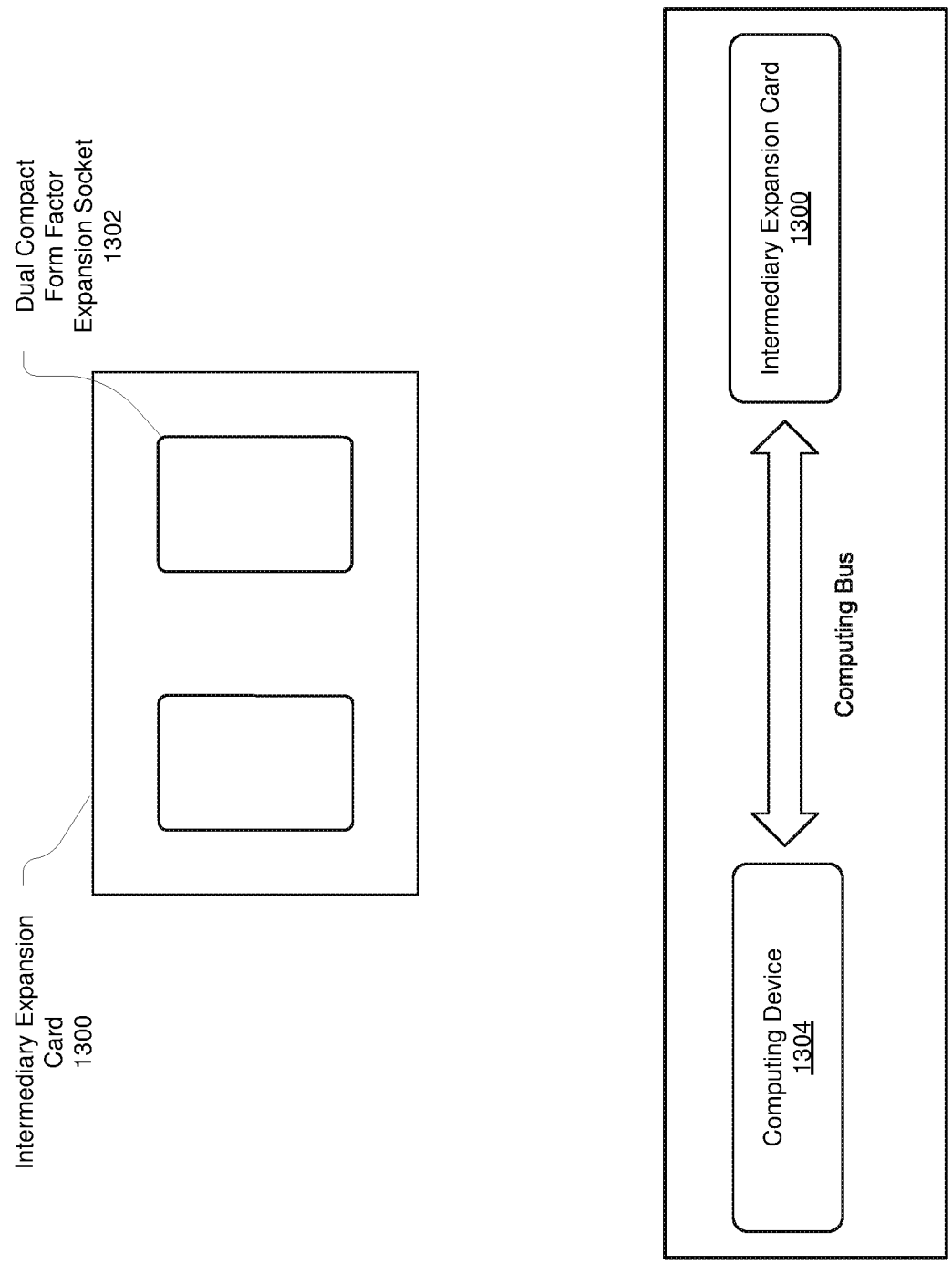
FIG. 13 is a block diagram of an example intermediary expansion card that may include dual-compact-form-factor expansion sockets described herein.

In some examples, an expansion socket 100 may be disposed on an intermediary expansion card. In some examples, an "intermediary expansion card" may refer to any expansion card that includes at least one expansion socket dimensioned to accept an additional expansion card in a nested fashion, as discussed further below. As shown in FIG. 13, an exemplary intermediary expansion card 1300 may include two or more separate dual-compact-form-factor expansion sockets 1302, each of which may be dimensioned to accept an instance of expansion card 500. In the specific example of FIG. 13, intermediary expansion card 1300 may include two separate expansion sockets 100 that may each accept an instance of expansion card 500, or one or more instances of expansion card 900. The specific number of expansion sockets is merely illustrative, and other examples of intermediary expansion card 1300 may include a fewer or greater number of dual-compact-form-factor expansion sockets.

In some examples, intermediary expansion card 1300 may include an edge connector having a pinout that conforms to a pinout specification defined for a computing bus to which intermediary expansion card 1200 is designed to be connected. For example, the pinout of the edge connector of intermediary expansion card 1300 may conform to the PCI EXPRESS specification. Thus, when the edge connector of intermediary expansion card 1300 is inserted into a PCI EXPRESS expansion socket on a computing device (such as computing device 1204), intermediary expansion card 1300 may be coupled to the PCI EXPRESS computing bus of the computing device.

In contrast, dual-compact-form-factor expansion socket 1302, which may be dimensioned to receive a dual-compact-form-factor expansion card, may include a plurality of slots that are each configured to receive a pinout that conforms to a compact pinout specification that is more compact than a pinout specification defined for the computing bus to which intermediary expansion card 1300 is connected. For example, a primary slot and/or a secondary slot included in expansion socket 100 may be dimensioned to receive and electrically couple to at least a portion of an edge connector that conforms to a pinout specification defined for the M.2 standard, which is more compact than the pinout specification defined by the PCI EXPRESS standard, such that each pinout that expansion socket 100 may receive may be more compact than the pinout specification of the computing bus (i.e., the PCI EXPRESS computing bus) to which the expansion card is ultimately connected (via intermediary expansion card 1300).

Figure 14:
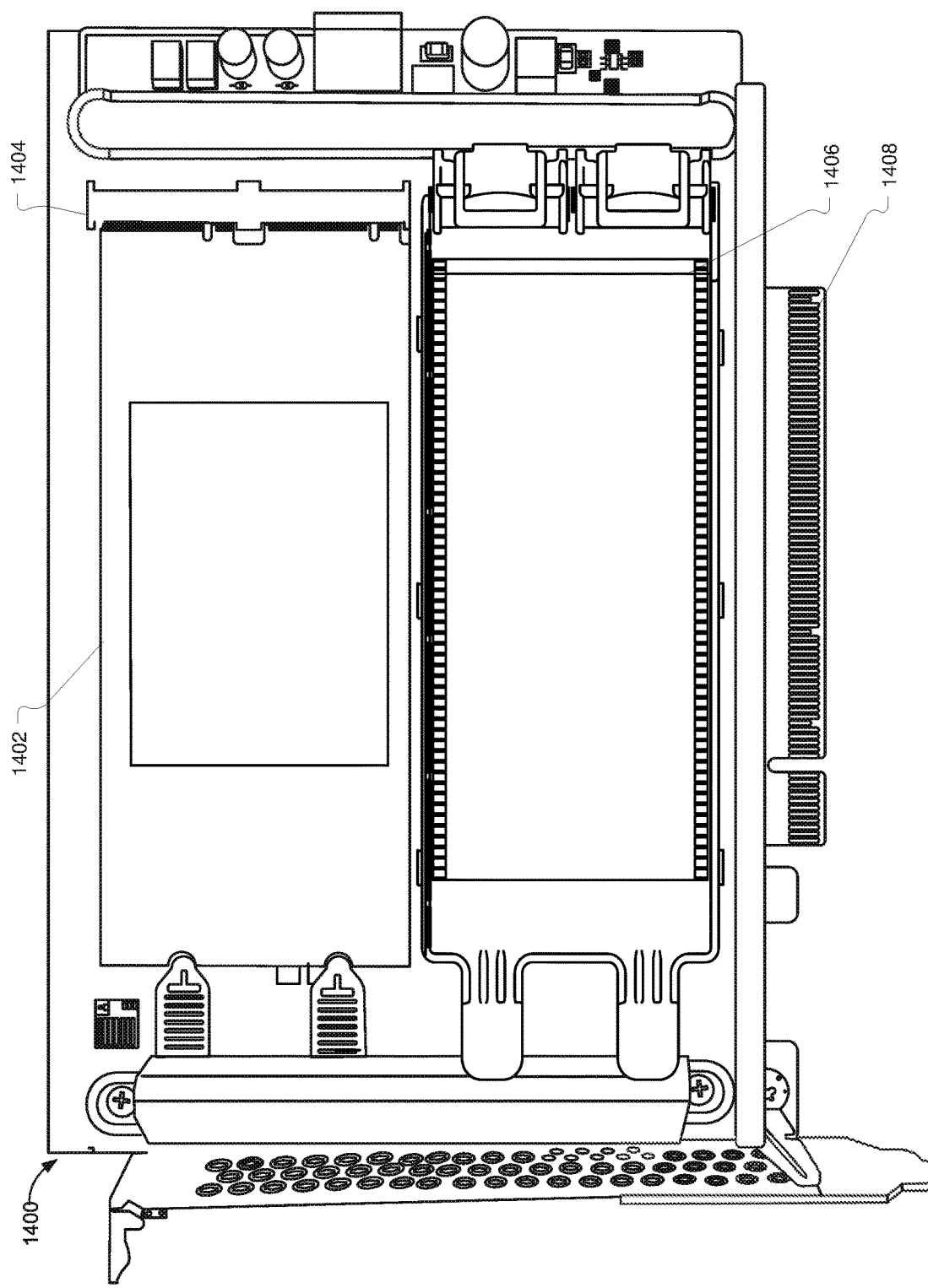
FIG. 14 is a plan view of an example intermediary expansion card that includes an example dual-compact-form-factor expansion card that is inserted into an example dual-compact-form-factor expansion socket, as well as an additional example dual-compact-form-factor expansion card that is fitted with a removable heat sink and inserted into an additional example dual-compact-form-factor expansion socket.

FIG. 14 is a plan view of an example intermediary expansion card 1400 that may include two dual-compact-form-factor expansion sockets for accepting two separate dual-compact-form-factor expansion cards, such as two instances of expansion card 500, as discussed above. As shown in this figure, a dual-compact-form-factor expansion card 1402 may be inserted into a corresponding dual-compact-form-factor expansion socket 1404, thereby providing hardware acceleration functionality to intermediary expansion card 1400. Intermediary expansion card 1400 may also include an additional dual-compact-form-factor expansion card inserted into an additional corresponding dual-compact-form-factor expansion socket, but the additional expansion card and the additional expansion socket may be obscured by heat sink 1406 that may be affixed to the additional dual-compact-form-factor expansion card. Heat sink 1306 may illustrate one of a variety of devices that may provide cooling to one or more dual-compact-form-factor expansion cards. Furthermore, as shown in this figure, intermediary expansion card 1300 may also include an edge connector 1408, which in this example may be dimensioned or formatted according to the PCI EXPRESS pinout specification.

As first discussed above, dual-compact-form-factor expansion sockets may enable scaling of the disclosed systems along a variety of dimensions, including, for example, by increasing the number of instances of expansion cards with hardware accelerators such as expansion card 500 and/or expansion card 900 within a computing device, increasing the number of modular computing devices or modular storage devices (each of which may contain instances of expansion card 500 and/or instances of expansion card 900), increasing the number of sleds connected within the chassis of a multi-node compute platform (each of which may contain multiple modular computing and/or storage devices), and/or increasing the number of server racks or chassis within a multi-node compute platform.

As such, the disclosed systems and methods demonstrate that a multi-node compute platform may be designed or retrofitted to conveniently and granularly scale via dual-compact-form-factor expansion sockets that may integrate hardware accelerators into the multi-node compute platform. By inserting one or more expansion cards (such as expansion card 500 with hardware accelerator 504 or expansion card 900 with hardware accelerator 904) into a dual-compact-form-factor expansion socket included in such a platform, the additional resources and capabilities provided by such expansion cards may be conveniently and immediately made available to a corresponding program, service, application, and/or process.

Figure 15:
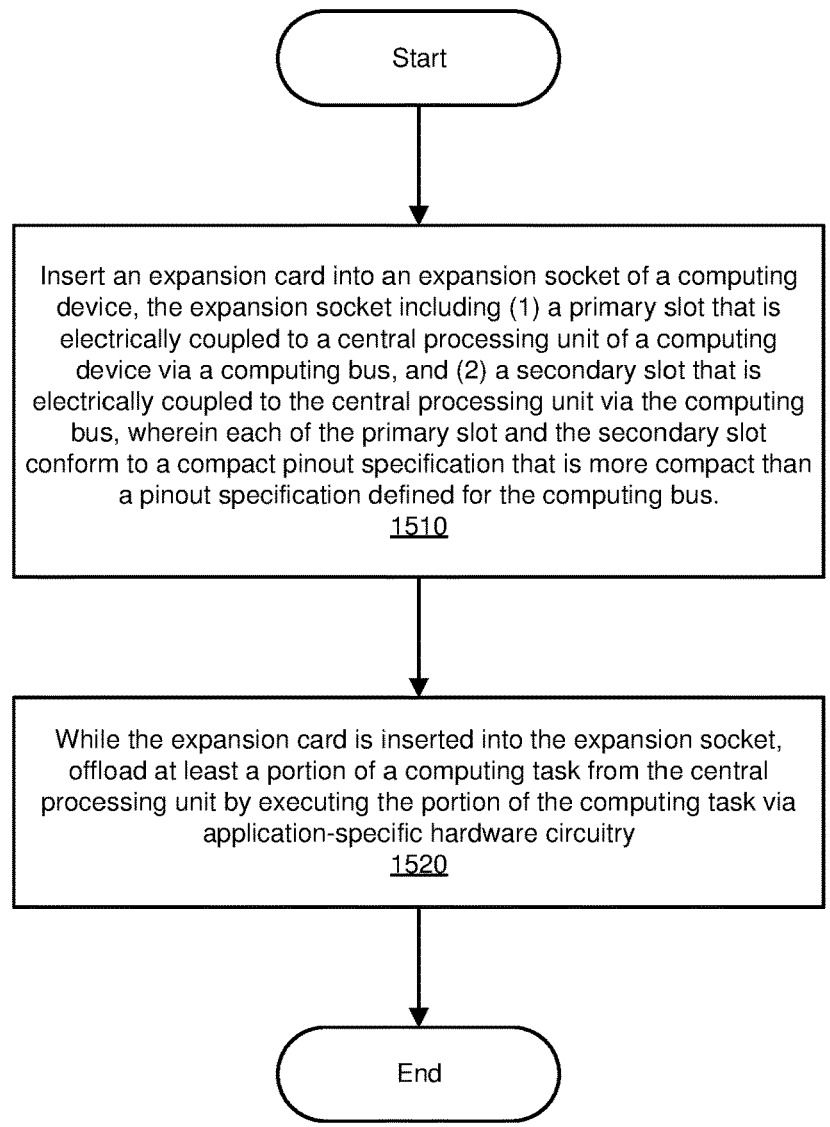
FIG. 15 is a flow diagram of an example method for integrating a hardware accelerator into a computing system via a dual-compact-form-factor expansion socket in accordance with some embodiments.

FIG. 15 is a flow diagram of an example method 1500 for performing hardware acceleration. The steps shown in FIG. 15 may be performed by any suitable person, mechanical device, automated system, computer-executable code, and/or computing system, including the system discussed above in the context of FIGS. 10-14 and/or variations or combinations of one or more of the same. In one example, each of the steps shown in FIG. 15 may represent an algorithm whose structure includes and/or is represented by multiple sub-steps, examples of which will be provided in greater detail below.

As illustrated in FIG. 15, at step 1510, one or more of the entities described herein may insert an expansion card into an expansion socket of a computing device. For example, a data center administrator, data center robot, original equipment manufacturer, and/or automated management system may, as part of one or more of the systems shown in FIGS. 10-14, insert an expansion card (e.g., at least one of expansion card 500 or expansion card 900) into an expansion socket 100 included in a computing device, such as a module within a multi-node compute platform (e.g., modular computing device 1004 and/or modular storage device 1002), and/or an intermediary expansion card (such as intermediary expansion card 1300).

An expansion card may be inserted into an expansion socket 100 in a variety of ways. For example, an expansion card 500 may be inserted into expansion socket 100 in a manner that parallels the insertion of expansion card 500 shown in FIGS. 8A-8C. In other words, the insertion of expansion card 500 into the computing device may involve inserting screws 804 into corresponding fixing notches 806 to fixedly secure expansion card 500 against a corresponding expansion socket 100. Moreover, insertion of an expansion card 500 into an expansion socket 100 may involve aligning an edge connector 508 with the corresponding set of slots included in expansion socket 100 and then pushing or embedding each portion of edge connector 508 securely within a corresponding slot included in expansion socket 100. Furthermore, in the context of the embodiment of FIGS. 13 and 14, inserting an expansion card into an expansion socket may further include inserting an expansion card into a socket, such as dual-compact-form-factor expansion socket 1302, of an intermediary expansion card such as intermediary expansion card 1300.

Moreover, in some examples, example method 1500 may further include scaling hardware acceleration capabilities of the computing device by inserting an additional expansion card into an additional expansion slot of the computing device. In general, the additional expansion slot may parallel the structure and/or functionality of expansion sockets included in expansion socket 100, and the additional expansion card may parallel the structure and/or functionality of expansion card 500 or expansion card 900. For example, the additional expansion card may include a hardware accelerator (e.g., an instance of hardware accelerator 504) that further includes application-specific hardware circuitry designed to perform the computing task. Similarly, the additional expansion socket may also further include an additional plurality of expansion slots that each may be dimensioned and/or positioned to receive a compact pinout (e.g., a pinout that conforms to a compact pinout specification, such as an M-key pinout specification included in the M.2 specification) that is more compact than the pinout specification defined for the computing bus (e.g., the PCI EXPRESS computing bus specification).

Returning to FIG. 15, at step 1520, one or more of the systems described above may, while the expansion card is inserted into the expansion socket, offload at least a portion of a computing task from the central processing unit by executing the portion of the computing task via application-specific hardware circuitry. For example, hardware accelerator 504 may, as part of the system of FIGS. 10-14, offload a portion of the computing task, such as an artificial intelligence inference task and/or a video transcoding task, from a central processing unit by executing, via application-specific hardware circuitry 506, the portion of the computing task.

Hardware accelerator 504 may offload the portion of the computing task in a variety of ways. In general, hardware accelerator 504 may offload the portion of the computing task in a manner that parallels the discussion of hardware accelerator 504 above in connection with FIGS. 5-7. More specifically, hardware accelerator 504 may perform at least a portion of the computing task itself and, therefore, alleviate one or more central processing units from the burden of performing at least a portion of the computing task. Moreover, as further discussed above, hardware accelerator 504 may perform at least a portion of the computing task in hardware, rather than performing the portion of the computing task in software, and may thereby perform the portion of the computing task in a faster and more efficient manner than a central processing unit may be capable of performing the portion of the task.

As discussed throughout the instant disclosure, the disclosed apparatuses, systems, and methods may provide one or more advantages over traditional options for integrating hardware accelerators into computing systems. For example, embodiments of this disclosure may enable dual-compact-form-factor expansion cards to utilize advanced hardware accelerators that may require and/or may utilize more resources than may be available from traditional compact-form-factor expansion sockets (e.g., M.2 expansion sockets, U.2 expansion sockets, mSATA expansion sockets, etc.). Such hardware accelerators may more efficiently and/or effectively perform complex computational tasks than hardware accelerators that may be integrated into computing systems in other ways (e.g., via traditional compact-form-factor expansion sockets).

Moreover, dual-compact-form-factor expansion sockets, as disclosed herein, may be configured to integrate either a single dual-compact-form-factor expansion card, a single traditional compact-form-factor expansion card (e.g., an M.2 expansion card), or a plurality of traditional compact-form-factor expansion cards into a computing system. Therefore, such dual-compact-form-factor expansion sockets may provide various functions and/or capabilities—including hardware acceleration capabilities—to computing devices via traditional compact-form-factor expansion cards (e.g., traditional M.2 expansion cards) as well as via dual-compact-form-factor expansion cards. Furthermore, by utilizing existing compact expansion card specifications, the dual-compact-form-factor expansion sockets disclosed herein may be less complicated to design, simpler to produce, and/or less expensive to deploy than other traditional expansion cards.

Hence, by efficiently and effectively integrating hardware accelerators into computing systems, the disclosed apparatuses, systems, and methods of this disclosure may effectively offload complex computational tasks from central processing units of computing devices to hardware accelerators. This may alleviate or ameliorate a burden on the central processing unit of the computing system that may otherwise be requested to perform such complex computational tasks (e.g., a domain controller).

Likewise, embodiments of this disclosure may enable system administrators to flexibly devise, implement, deploy, and/or scale effective custom hardware acceleration strategies while avoiding costs associated with less flexible conventional technologies. Accordingly, the disclosed apparatuses, systems, and method may enable technology enterprises to better handle and adapt to increases in the demand for infrastructure capable of managing computationally expensive computing tasks.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples since many other architectures may be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An expansion socket comprising:
a receiver printed circuit board that is electrically coupled to a central processing unit of a computing device via a computing bus;
a primary slot, mounted to the receiver printed circuit board via a mounting portion of the primary slot and electrically coupled to the central processing unit via the computing bus, wherein the primary slot:
is dimensioned to receive a primary pinout disposed within a primary portion of an edge connector, the edge connector disposed on a connecting edge of a presenter printed circuit board; and
electrically couples the primary portion of the edge connector to the central processing unit via the primary pinout while the primary portion of the edge connector is inserted into the primary slot;
a secondary slot, mounted to the receiver printed circuit board via a mounting portion of the secondary slot and electrically coupled to the central processing unit via the computing bus, wherein the secondary slot:
is positioned on the receiver printed circuit board and dimensioned to receive a secondary pinout disposed within a secondary portion of the edge connector when the primary slot receives the primary portion of the edge connector; and
electrically couples the secondary portion of the edge connector to the central processing unit via the secondary pinout while the secondary portion of the edge connector is inserted into the secondary slot; and
wherein each of the primary pinout and the secondary pinout conform to a compact pinout specification, included in a compact expansion card specification, that is more compact than a pinout specification defined for the computing bus, the compact expansion card specification comprising at least one of:
an M.2 specification;
a U.2 specification; or
an mSATA specification.

2. The expansion socket of claim 1, wherein:
the primary slot comprises a primary plurality of female contacts disposed within the primary slot in accordance with the compact pinout specification; and
the secondary slot comprises a secondary plurality of female contacts disposed within the secondary slot in accordance with the compact pinout specification.

3. The expansion socket of claim 1, wherein the primary slot and the secondary slot are disposed upon the receiver printed circuit board such that:
the primary slot and the secondary slot are each oriented in a common direction;
a central longitudinal axis of the secondary slot is aligned parallel to a central longitudinal axis of the primary slot;
the central longitudinal axis of the secondary slot is positioned along the central longitudinal axis of the primary slot; and
a central lateral axis of the primary slot is disposed a predefined distance from a central lateral axis of the secondary slot.

4. The expansion socket of claim 3, wherein the predefined distance from the central lateral axis of the secondary slot is, within a predefined manufacturing tolerance, up to 22.5 millimeters.

5. The expansion socket of claim 1, wherein each of the primary slot and the secondary slot comprise a predetermined width dimension that conforms to a width specification included in the compact expansion card specification.

6. The expansion socket of claim 5, wherein the predetermined width dimension of each of the primary slot and the secondary slot is, within a predefined manufacturing tolerance, 20.15 millimeters.

7. The expansion socket of claim 1, wherein:
the primary slot defines a primary alignment key in accordance with the compact expansion card specification, the primary alignment key comprising a predefined key width; and
the secondary slot defines a secondary alignment key in accordance with the compact expansion card specification, the secondary alignment key comprising the predefined key width.

8. The expansion socket of claim 7, wherein the predefined key width is at least, within a predefined manufacturing tolerance, 1.1 millimeters.

9. The expansion socket of claim 1, wherein the expansion socket further comprises a height dimension sufficient to accommodate a heat sink coupled to the presenter printed circuit board when the primary portion of the edge connector is inserted into the primary slot and the secondary portion of the edge connector is inserted into the secondary slot.

10. The expansion socket of claim 9, wherein the height dimension is at least, within a predefined manufacturing tolerance, 6.7 millimeters.

11. The expansion socket of claim 1, wherein the receiver printed circuit board comprises an intermediary expansion card that comprises a pinout that conforms to the pinout specification defined for the computing bus.

12. The expansion socket of claim 1, wherein, while the primary portion of the edge connector is inserted into the primary slot and the secondary portion of the edge connector is inserted into the secondary slot:
a hardware accelerator, disposed on the presenter printed circuit board and that includes application-specific hardware circuitry designed to perform a computing task, is electrically coupled to the central processing unit via the edge connector; and the hardware accelerator offloads at least a portion of the computing task from the central processing unit by executing, via the application-specific hardware circuitry, the portion of the computing task.

13. A system comprising:
a central processing unit;
at least one memory device;
at least one expansion card comprising:
   a presenter printed circuit board; and
   an edge connector disposed on a connecting edge of the presenter printed circuit board, the edge connector comprising a primary portion and a secondary portion;
at least one expansion socket comprising:
   a receiver printed circuit board that is electrically coupled to the central processing unit via a computing bus;
   a primary slot, mounted to the receiver printed circuit board via a mounting portion of the primary slot and electrically coupled to the central processing unit via the computing bus, wherein the primary slot:
      is dimensioned to receive a primary pinout disposed within the primary portion of the edge connector;
      electrically couples the primary portion of the edge connector to the central processing unit via the primary pinout when the primary portion of the edge connector is inserted into the primary slot;
   a secondary slot, mounted to the receiver printed circuit board via a mounting portion of the secondary slot and electrically coupled to the central processing unit via the computing bus, wherein the secondary slot:
      is positioned on the receiver printed circuit board and dimensioned to receive a secondary pinout disposed within the secondary portion of the edge connector when the primary slot receives the primary portion of the edge connector; and
      electrically couples the secondary portion of the edge connector to the central processing unit via the secondary pinout when the secondary portion of the edge connector is inserted into the secondary slot; and
   wherein each of the primary pinout and the secondary pinout conform to a compact pinout specification, included in a compact expansion card specification, that is more compact than a pinout specification defined for the computing bus, the compact expansion card specification comprising at least one of:
      an M.2 specification;
      a U.2 specification; or
      an mSATA specification.

14. The system of claim 13, wherein the receiver printed circuit board comprises an intermediary expansion card that comprises a pinout that conforms to the pinout specification defined for the computing bus.

15. The system of claim 13, further comprising a chassis that is dimensioned to accept a plurality of modular computing devices, wherein the expansion socket is included in a modular computing device inserted into the chassis.

16. The system of claim 13, further comprising a chassis that is dimensioned to accept a plurality of modular storage devices, wherein the expansion socket is included in a modular storage device inserted into the chassis.

17. The system of claim 13, wherein the system comprises a backend data center of a corporate networking enterprise that provides at least one online service to corresponding users of client devices.

18. The system of claim 17, wherein the online service comprises at least one of:
   a social networking service;
   a virtual reality service; or
   a cloud storage service.

19. A method comprising:
inserting an expansion card into an expansion socket of a computing device, the expansion socket comprising:
   a receiver printed circuit board that is electrically coupled to a central processing unit of the computing device via a computing bus;
   a primary slot, mounted to the receiver printed circuit board via a mounting portion of the primary slot and electrically coupled to the central processing unit of the computing device via the computing bus, wherein the primary slot:
      is dimensioned to receive a primary pinout disposed on a primary portion of an edge connector, the edge connector disposed on a connecting edge of a presenter printed circuit board included as part of the expansion card;
      electrically couples the primary portion of the edge connector to the central processing unit via the primary pinout when the primary portion of the edge connector is inserted into the primary slot;
   a secondary slot, mounted to the receiver printed circuit board via a mounting portion of the secondary slot and electrically coupled to the central processing unit via the computing bus, wherein the secondary slot:
      is positioned on the receiver printed circuit board and dimensioned to receive a secondary pinout, disposed on a secondary portion of the edge connector, when the primary slot receives the primary portion of the edge connector;
      electrically couples the secondary portion of the edge connector to the central processing unit via the secondary pinout when the secondary portion of the edge connector is inserted into the secondary slot;
   wherein each of the primary pinout and the secondary pinout conform to a compact pinout specification, included in a compact expansion card specification, that is more compact than a pinout specification defined for the computing bus, the compact expansion card specification comprising at least one of:
      an M.2 specification;
      a U.2 specification; or
      an mSATA specification; and
while the expansion card is inserted into the expansion socket, offloading at least a portion of a computing task from the central processing unit by executing the portion of the computing task via application-specific hardware circuitry included in a hardware accelerator disposed on the presenter printed circuit board and designed to perform the computing task, wherein the hardware accelerator is electrically coupled to the central processing unit via the edge connector while the expansion card is inserted into the expansion socket.

20. The expansion socket of claim 1, wherein the pinout specification defined for the computing bus comprises a PCI EXPRESS computing bus specification.

* * * * *